(12) United States Patent  (10) Patent No.: US 8,754,714 B2
Bae et al.  (45) Date of Patent: Jun. 17, 2014

(54) SIGNAL PATTERN AND DISPERSION TOLERANT STATISTICAL REFERENCE OSCILLATOR

(75) Inventors: Hyeon-Min Bae, Seoul (KR); Jinho Han, Daejeon (KR)

(73) Assignee: Terasquare Co., Ltd. (KR)

( * ) Notice: Subject to any disclaimer, the term of this patent is extended or adjusted under 35 U.S.C. 154(b) by 198 days.

(21) Appl. No.: 13/299,919

(22) Filed: Nov. 18, 2011

(65) Prior Publication Data

US 2012/0126867 A1  May 24, 2012

(30) Foreign Application Priority Data

Nov. 19, 2010  (KR) .................. 10-2010-0115855
Oct. 20, 2011  (KR) .................. 10-2011-0107628

(51) Int. Cl.
 *H03L 7/00*  (2006.01)
(52) U.S. Cl.
 USPC .............. 331/16; 331/17; 327/156; 327/157; 327/158

(58) Field of Classification Search
 USPC .................... 331/16, 17; 327/156–158
 See application file for complete search history.

(56) References Cited

U.S. PATENT DOCUMENTS

| 2005/0017772 | A1* | 1/2005 | Hsiao et al. | 327/156 |
| 2005/0218999 | A1* | 10/2005 | Jasa et al. | 331/16 |
| 2007/0252902 | A1* | 11/2007 | Lin et al. | 348/231.4 |
| 2011/0051639 | A1* | 3/2011 | Ramakrishnan et al. | 370/311 |

* cited by examiner

*Primary Examiner* — Joseph Chang
*Assistant Examiner* — Jeffrey Shin
(74) *Attorney, Agent, or Firm* — The Belles Group, P.C.

(57) ABSTRACT

Disclosed is a statistical reference oscillator that includes: a stochastic reference clock generator which receives an input data outputs a reference signal obtained by dividing the received input data at a first frequency division ratio; a frequency divider which divides the frequency of an output signal at a second frequency division ratio and outputs a feedback signal; a frequency detector which outputs a difference signal based on a difference between the reference signal and the feedback signal; and an output signal generator which outputs the output signal based on the difference signal.

16 Claims, 22 Drawing Sheets

SIGNAL PATTERN AND DISPERSION TOLERANT STATISTICAL REFERENCE OSCILLATOR

CROSS REFERENCE TO RELATED APPLICATIONS

This application claims priority under 35 U.S.C. §119 to Korean Patent Application No. 10-2011-0107628 filed on Oct. 20, 2011 and to Korean Patent Application No. 10-2010-0115855 filed on Nov. 19, 2010, the entireties of which are hereby incorporated by reference.

FIELD OF THE INVENTION

The present invention relates to a signal pattern and dispersion tolerant statistical reference oscillator.

BACKGROUND OF THE INVENTION

Most wired communication systems including a phase locked loop (PLL) with a limited pull-in range require an additional frequency acquisition loop. A phase frequency detector (PFD) which is typically used in the frequency acquisition loop requires an external reference clock such as a crystal oscillator. This causes the increase of the cost and electric power consumption of an entire system.

Various reference-less clock and data recovery (CDR) technologies directly extract data rate from input data. Also, some of the technologies make use of a frequency detector based on a finite-state machine (FSM). Another technology makes use of a frequency locked loop (FLL) based on a delay locked loop (DLL). Further another technology makes use of a line coding analyzer.

However, the technologies mentioned above have a limit in being commercialized in a high speed wired communication industry because it is difficult to manufacture a complex logic block which operates at a speed of the input data. Moreover, the logic block excessively consumes electric power and depends on the kind of an oscillator which is used and on the pattern of the input data.

Regarding a prior art voltage controlled delay line (VCDL), all of the chips cannot provide the same delay due to process voltage and temperature (PVT) variation. Therefore, this causes inaccurate frequency locking.

Consequently, demand on a technology are made, which makes it possible to easily manufacture the logic block, to reduce electric power consumption of the logic block and to provide accurate frequency locking.

SUMMARY OF THE INVENTION

One embodiment is a statistical reference oscillator. The statistical reference oscillator includes: a stochastic reference clock generator which receives an input data outputs a reference signal obtained by dividing the received input data at a first frequency division ratio; a frequency divider which divides the frequency of an output signal at a second frequency division ratio and outputs a feedback signal; a frequency detector which outputs a difference signal based on a difference between the reference signal and the feedback signal; and an output signal generator which outputs the output signal based on the difference signal.

The stochastic reference clock generator includes a multiple threshold slicer and a frequency divider. The multiple threshold slicer detects a signal of the input data by using multiple thresholds. The frequency divider of the stochastic reference clock generator divides an input signal from the multiple threshold slicer at the first division ratio.

The statistical reference oscillator may further include a CID compensation block which prevents a non-random signal within the input data from being inputted to the frequency detector by skipping the non-random signal.

DETAILED DESCRIPTION

Figure 1:
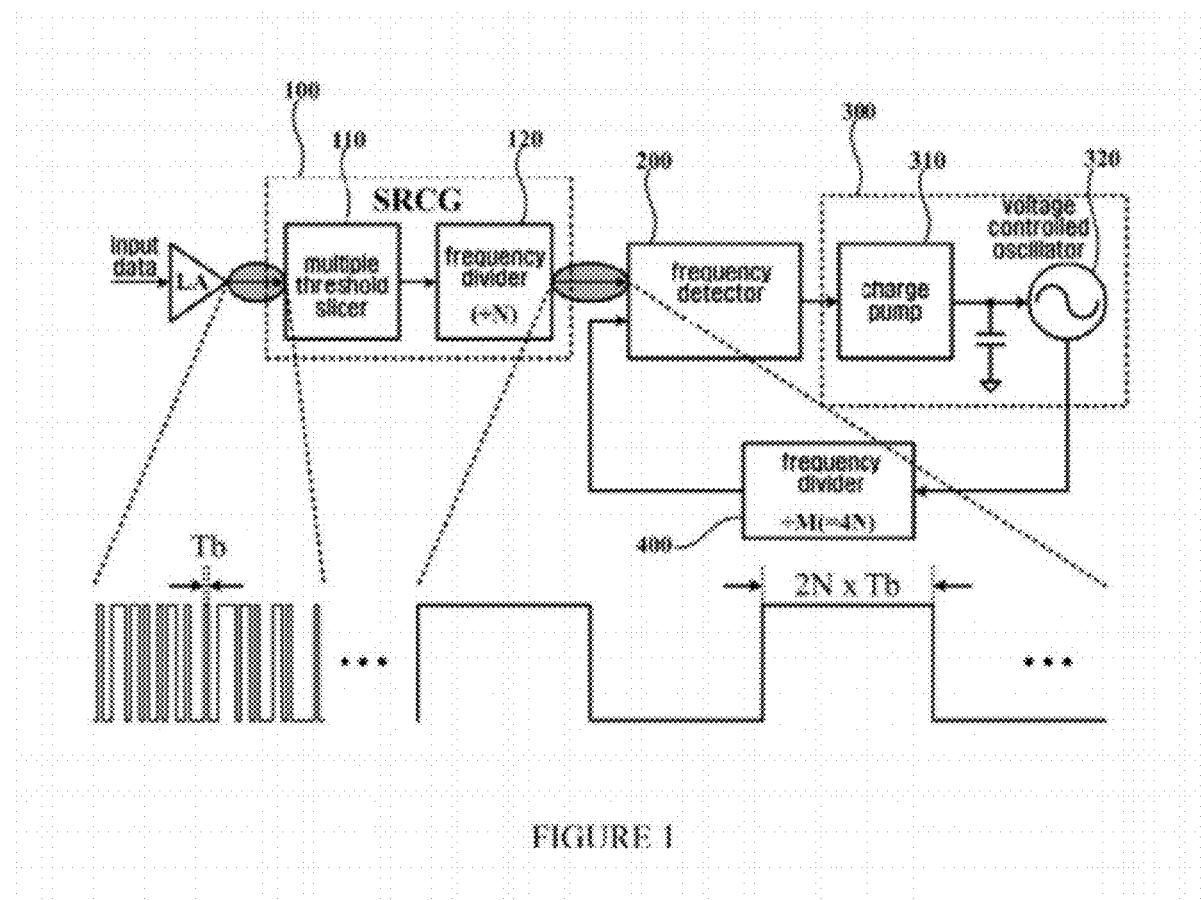
FIG. 1 shows a statistical reference oscillator according to an embodiment of the present invention.

Hereafter, an exemplary embodiment of the present invention will be described in detail with reference to the accompanying drawings. It is noted that the same reference numerals are used to denote the same elements throughout the drawings. In the following description of the present invention, the detailed description of known functions and configurations incorporated herein is omitted when it may make the subject matter of the present invention unclear.

FIG. 1 shows a statistical reference oscillator according to an embodiment. The statistical reference oscillator according to the embodiment shown in FIG. 1 includes a stochastic reference clock generator (SRCG) 100 which receives input data and outputs a reference signal obtained by dividing the received input data at a first frequency division ratio, a frequency divider 400 which divides the frequency of the output signal at a second frequency division ratio and outputs a feedback signal, a frequency detector 200 which outputs a difference signal based on a difference between the reference signal and the feedback signal, and an output signal generator 300 which outputs the output signal based on the difference signal. The statistical reference oscillator according to the embodiment may further selectively include a consecutive identical digit (CID) compensation block.

In the embodiment, a frequency locked loop (FLL) is configured by the frequency divider 400, the frequency generator 200 and the output signal generator 300.

The SRCG 100 according to the embodiment may include a multiple threshold slicer 110 and a frequency divider 120. The multiple threshold slicer 110 detects a signal of the input data by using multiple thresholds and inputs the detected input data signal to the frequency divider 120. This will be described later in detail in connection with FIG. 21.

The frequency divider 120 generates and outputs a signal like a clock signal by dividing the input data at a first frequency division ratio "N". Such an output signal of the frequency divider 120 is designated as a reference signal. A transition probability of a random non-return-to-zero (NRZ) signal is 50%. Therefore, when input random data is divided by the frequency divider, the divided signal is outputted as if it were a reference clock having a duty cycle of 50% with the increase of the number of divisions. This is shown in FIG. 1. Accordingly, through use of the multi phase frequency divider 120, there is no necessity of an external device such as a crystal oscillator which is used to create a reference clock.

A time interval between neighboring transition edges of the random data divided by the frequency divider 120 according to the embodiment may be modeled by using a negative binomial random process. The time interval may be defined as an edge separation.

The negative binomial random process is represented by the number of repetitive trials until the occurrence of the expected number of successes. The number of the successes in the embodiment corresponds to the number of specific data transitions and the number of the trials corresponds to a unit interval ($T_{unit}$) of the divided random data.

In the random NRZ signal, a probability that a specific data transition occurs at an edge of the unit interval is 0.5. Cases in which the data transition occurs are independent of each other. If the frequency divider detects only a specific edge (e.g., a rising edge), a transition from the N-divided data to a specific data occurs every 2N data transitions. In this case, a probability that the specific edge exists in two unit interval ($2T_{unit}$) the divided random signal is 0.5.

Accordingly, through analysis of the N-divided signal, a mean $\mu$ and a variance $\sigma^2$ of the edge separation are as follows:

$$\mu_{ES} = \frac{N(1-p)}{p} T_{unit} \qquad \text{Equation (1)}$$

$$\sigma^2_{ES} = \frac{N(1-p)}{p^2} T^2_{unit} \qquad \text{Equation (2)}$$

Figure 2:
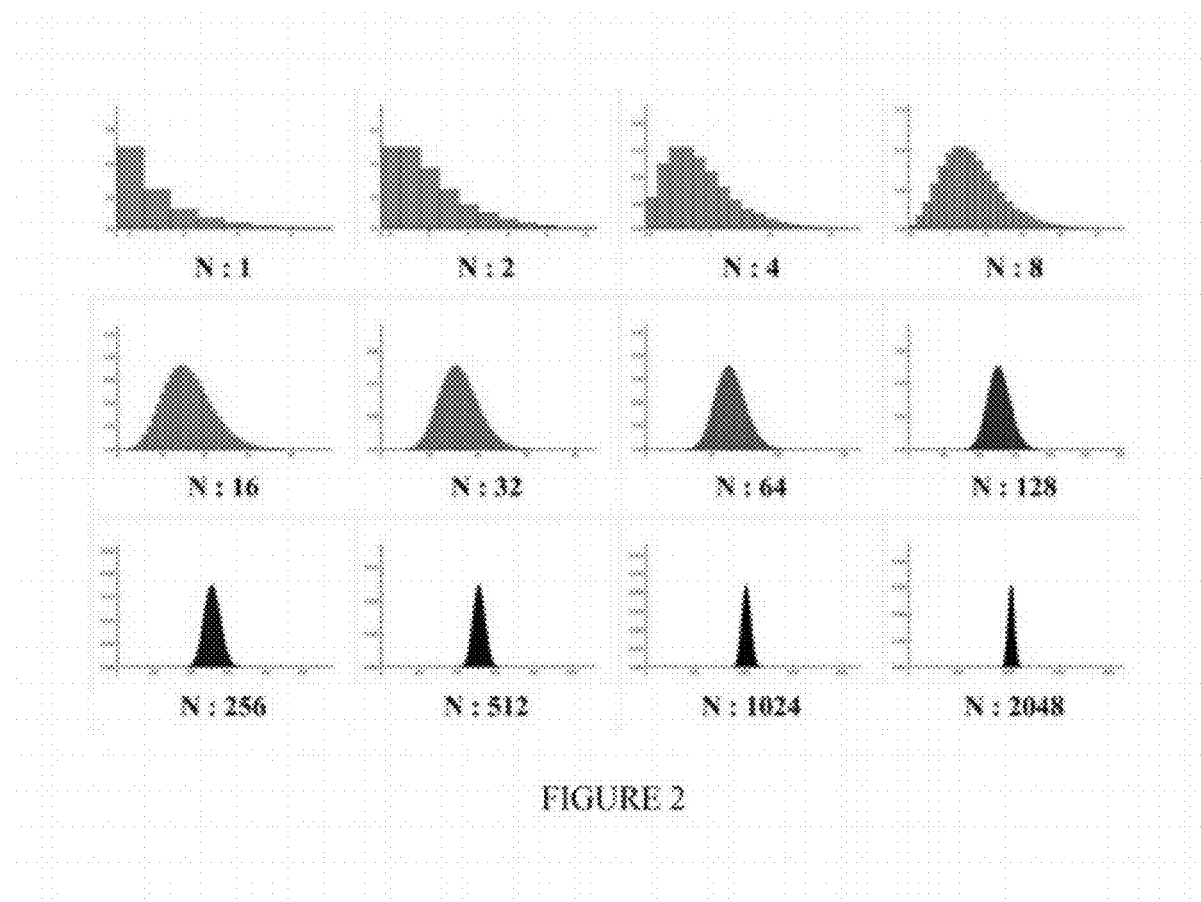
FIG. 2 shows a probability distribution of the edge separation of an N-divided input signal in accordance with the value of "N" according to an embodiment of the present invention.

The average frequency of the N-divided signal is $p/(2NT_{unit})$. FIG. 2 shows a probability distribution of the edge separation of the divided signal by changing the division ratio "N" into a multiple of 2 from 1 to 2,048. The more the division ratio increases, the closer the probability distribution is to a normal distribution by central limit theorem.

When the mean and the variance of the edge separation increase linearly with respect to "N", an RMS period jitter ($J_{period}$) of the SRCG 100 according to the embodiment may be defined as follows:

$$J_{P-half} = \frac{\sqrt{2}\sigma}{2\mu} = \sqrt{\frac{(1-p)}{2N}} \qquad \text{Equation (3)}$$

Figure 3:
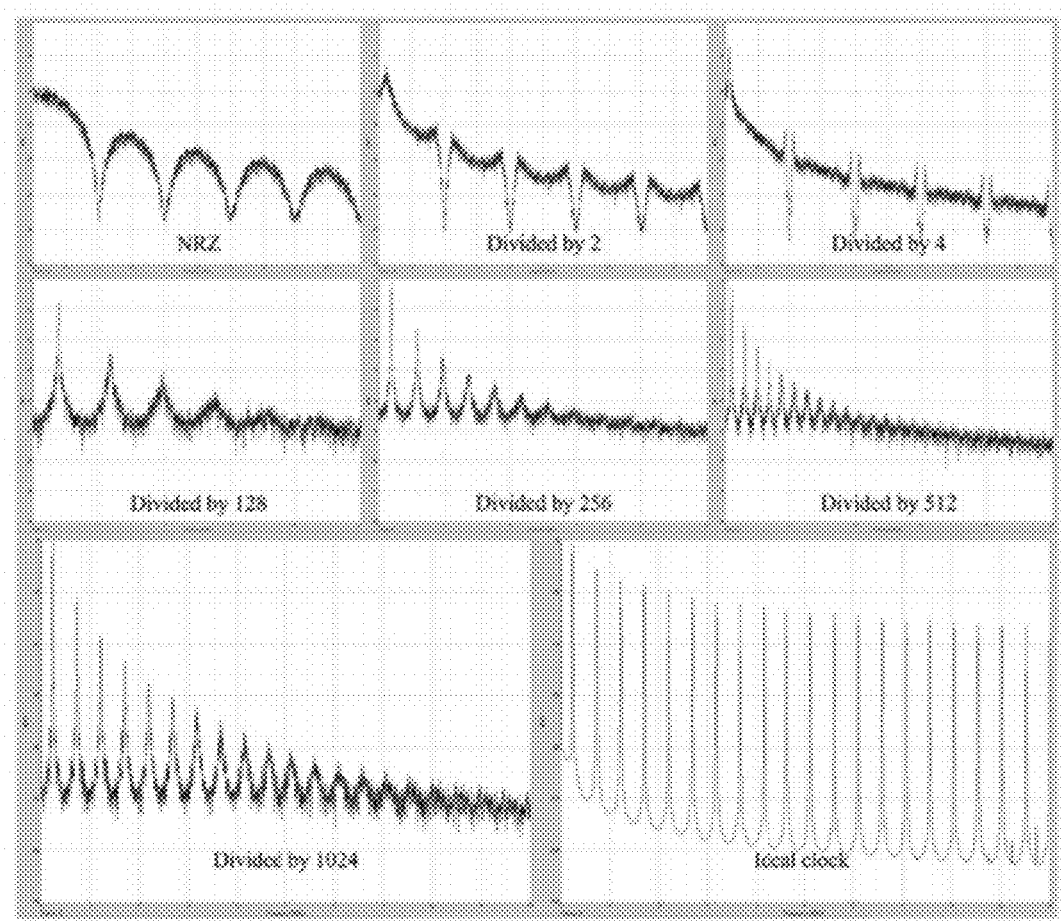
FIG. 3 shows power spectrum densities (PSD) of the divided NRZ signal and an ideal square wave clock signal through simulations according to an embodiment of the present invention.

Through equation (3), the $J_{period}$ is inversely proportional to $N^{1/2}$. That is, an output spectrum of the divided NRZ signal becomes closer to the clock signal with the increase of the division ratio. FIG. 3 shows power spectrum densities (PSD) of the divided NRZ signal and an ideal square wave clock signal through simulations. It can be seen that near a reference frequency, the PSD of the NRZ signal divided by N of 1,024 is similar to the PSD of the clock signal. Through this, it can be understood that the divided random signal is substantially able to function as a reference clock when the division ratio is 1,024 (N=1,024).

The mean, variance and period jitter of the divided data are shown in the following Table 1.

TABLE 1

| N | 32 | 64 | 128 | 256 | 512 | 1024 |
| --- | --- | --- | --- | --- | --- | --- |
| Mean(UI) | 128 | 256 | 512 | 1024 | 2048 | 4096 |
| Var.(UI) | 128 | 256 | 512 | 1024 | 2048 | 4096 |
| Jitter($UI_{rms}$) | 0.088 | 0.0625 | 0.0442 | 0.0315 | 0.0221 | 0.0156 |

An absolute jitter which is defined as a maximum phase deviation from an ideal clock edge is represented by a phase noise "L(f)" in a frequency domain. A phase jitter is defined as a time difference between an ideal cycle and an actual cycle. The radian of $\phi_k$ which is a phase jitter in the $k^{th}$ cycle is represented in the following radian expression.

$$\phi_k = 2\pi f_0(t_k - kT_0) \quad \text{Equation (4)}$$

Here, $T_0$ represents a cycle of the signal. Total output jitter is as follows:

$$\sigma_\phi^2 = \frac{1}{(2\pi f_0)^2} \int_{-f_0/2}^{f_0/2} S_\phi(f) df \quad \text{Equation (5)}$$

Here, $S_\phi$ represents a power spectrum density (PSD) of the phase jitter $\phi_k$.

The cycle of the SRCG is $2\mu_{ES}$. The period jitter is represented in the following equation.

$$\begin{aligned} J_{period,k} &= t_k - t_{k-1} - T_0 \\ &= (t_k - kT_0) - (t_{k-1} - (k-1)T_0) \\ &= \frac{\phi_k - \phi_{k-1}}{2\pi f_0} \end{aligned} \quad \text{Equation (6)}$$

Here, $t_k$ represents a zero crossing time of the $K^{th}$ cycle. $T_0 = 1/f_0$ represents a clock cycle. A period jitter sequence corresponds to a first derivative of an absolute jitter sequence, which can be modeled into $D(z) = 1 - z^{-1}$ in a Z domain. Therefore, $S_\phi(f)$, that is, a power spectrum density function of an absolute phase jitter has the following relation with the power spectrum density function of the period jitter.

$$S_{\Delta\phi}(f) = S_\phi(f) |D(z)D(z^{-1})|_{z=e^{j2\pi fT_0}} \quad \text{Equation (7)}$$

The variance of the period jitter of $\sigma_{\Delta\phi}^2$ is equal to $2\sigma_{ES}^2$ of Equation (2) and has the following relation with $S_{\Delta\phi}$.

$$\sigma_{\Delta\phi}^2 = \frac{1}{(2\pi f_0)^2} \int_{-f_0/2}^{f_0/2} S_{\Delta\phi}(f) df \quad \text{Equation (8)}$$

Since the period jitter of the SRCG is an independent white process, the power spectrum density function $S_{\Delta\phi}(f)$ is a constant as follows:

$$S_{\Delta\phi}(f) = \frac{(2\pi f_0)^2 \sigma_{\Delta\phi}^2}{f_0} \quad \text{Equation (9)}$$

The power spectrum density of the absolute phase is represented by equation (7) as follows:

$$\begin{aligned} S_\phi(f) &= \frac{(2\pi f_0)^2 \sigma_{\Delta\phi}^2}{4 f_0 \sin^2(\pi f T_0)} \\ &= \frac{2\pi^2(1-p)T_{unit}}{p^2} \times \frac{1}{4\sin^2(4\pi N T_{unit} f)} \end{aligned} \quad \text{Equation (10)}$$

D(z) of equation (7) is bilinearly transformed as follows:

$$S_\phi(f) = \frac{2\pi^2(1-p)T_{unit}}{p^2} \times \frac{1 + (4\pi N T_{unit})^2 f^2}{(8\pi N T_{unit})^2 f^2} \quad \text{Equation (11)}$$

Figure 4:
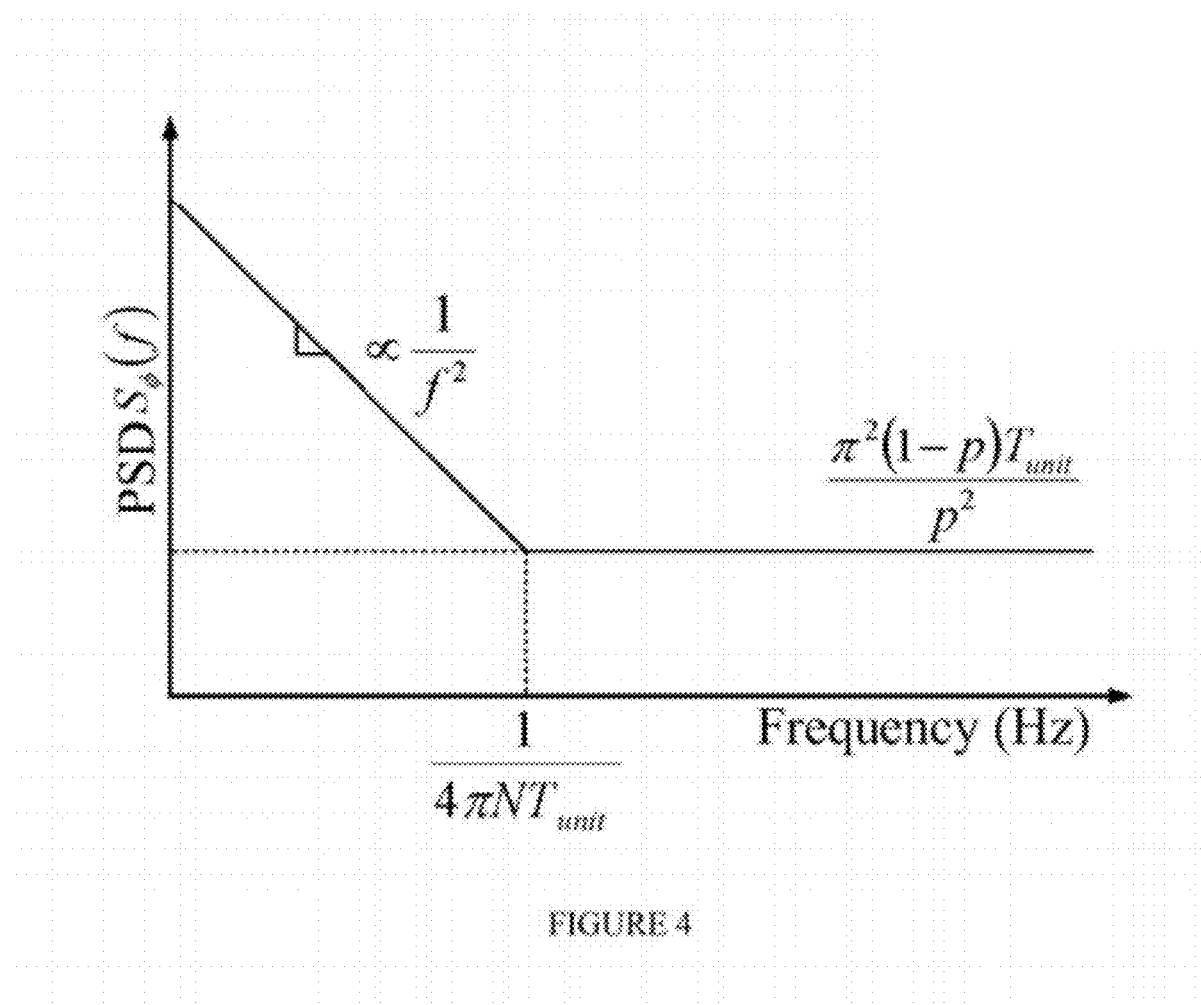
FIG. 4 shows a bilinearly-transformed single side band phase noise of a SRCG according to an embodiment of the present invention.

FIG. 4 shows a bilinearly-transformed single side band noise of the divided NRZ signal. 3-dB corner frequency is given as follows:

$$\frac{1 + (4\pi N T_{unit})^2 f_{3dB}^2}{(8\pi N T_{unit})^2 f_{3dB}^2} = 0.5 \quad \text{Equation (12)}$$

$$f_{3dB} = \frac{1}{4\pi N T_{unit}}$$

Figure 5:
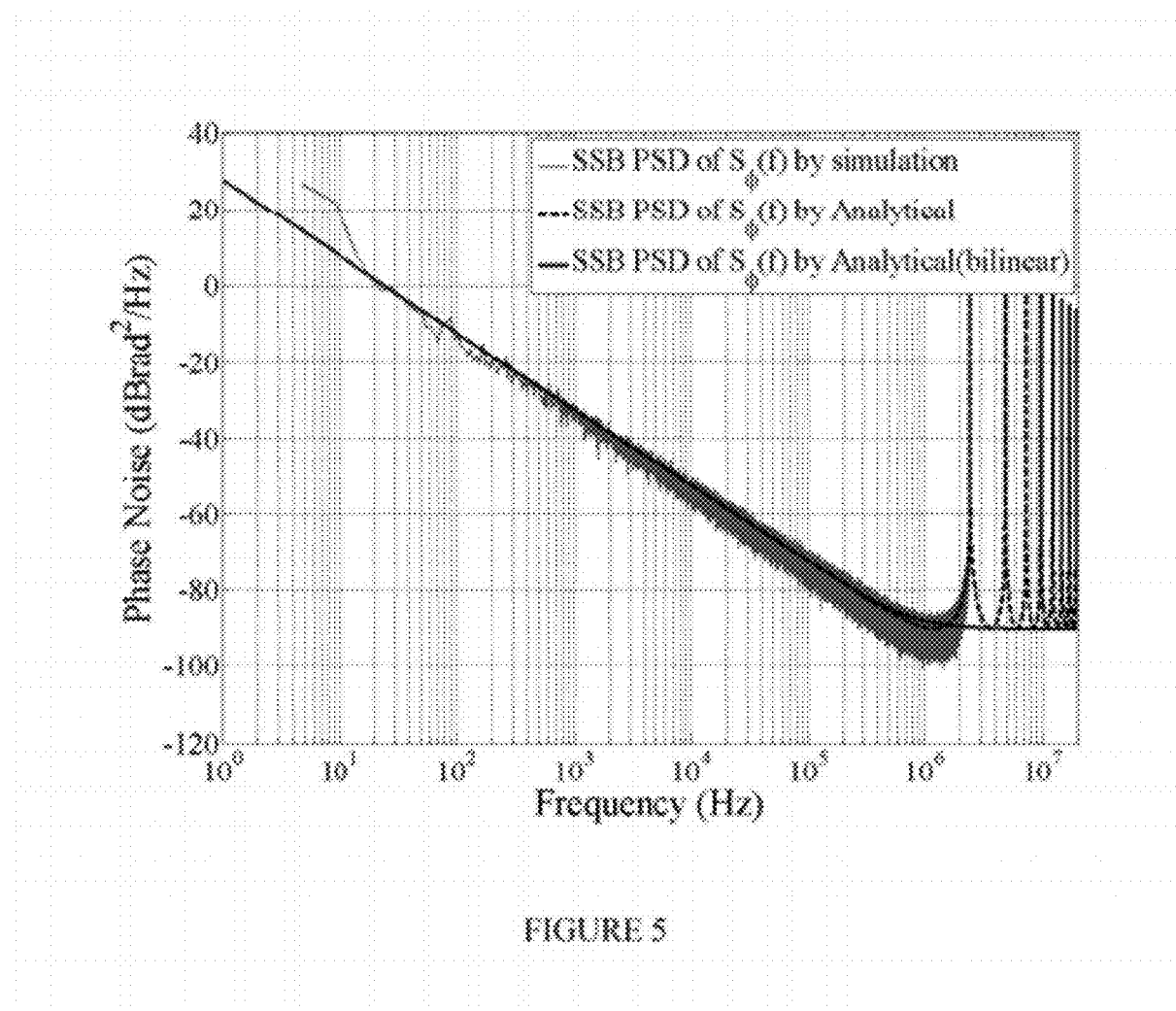
FIG. 5 shows a comparison of a theoretical form with a simulation result of the single side band phase noise of the SRCG according to an embodiment of the present invention.

An absolute power spectrum density (PSD) function of the divided NRZ signal linearly reduces in a $1/f^2$ region as the division ratio increases. A high frequency phase noise floor is located at $\pi^2(1-p)T_{unit}/p^2$ and h as nothing to do with the division ratio. FIG. 5 shows a theoretical form and a simulation result of the single side band phase noise for equations (10) and (I 1) when the division ratio "N" is 1,024 and a data transition probability "p" is 0.5.

The simulation result is exactly the same as equation (10). The simulation result is appropriately approximated to equation (11) in the $1/f^2$ region and is somewhat discrepant from equation (11) in a high frequency region. This is because that the bilinear transformation maps a region corresponding to $-\pi<\Omega<\pi$ in the Z domain on a region of $-\infty<f<\infty$ in a continuous time domain. However, the high frequency region phase noise floor which is expected through the bilinear transformation is equal to the minimum value of equation (10) and well represents an actual phase noise floor.

A SRCG output signal may be computed by using a PSD characteristic function expression 11 of $x_s(t+\phi(t))$. Here, since the $\phi(t)$ can be modeled by using Gaussian process when "N" is sufficiently large, the $\phi(t)$ is represented as follows:

$$S(\omega) = \sum_{i=-\infty}^{\infty} X_i X_i^* \frac{\omega_o^2 i^2 c}{\frac{1}{4}\omega_o^4 i^2 c^2 + (\omega + i\omega_o)^2} \quad \text{Equation (13)}$$

Here, c represents a power spectrum density function given by $S_{\Delta\phi}/(2\pi)^2 = \sigma_{\Delta\phi}^2/T_0$. $X_i$ represents a Fourier coefficient of $x_s(t)$ and is defined as follows:

$$x_s(t) = \sum_{i=-\infty}^{\infty} X_i \exp(ji\omega_o t) \quad \text{Equation (14)}$$

A normalized form of the single side band power spectrum is as follows:

$$L(f_m) = 10 \log_{10}\left(\frac{S_{ss}(f_0 + f_m)}{2|X_1|^2}\right) \quad \text{Equation (15)}$$

Here, $S_{ss}(f)=2S(2\pi f)$. The $L(f_m)$ approximated with respect to "c" of a small value and $0 \le f_{ss} \ll f_0$ is represented as follows:

$$L(f_m) \approx 10\log_{10}\left(\frac{f_0^2 c}{\pi^2 f_0^4 c^2 + f_m^2}\right) \approx \qquad \text{Equation (16)}$$

$$10\log_{10}\left(\frac{\frac{(1-p)}{32p^2 N^2 T_{unit}}}{\left(\frac{\pi(1-p)}{32p^2 N^2 T_{unit}}\right)^2 + f_m^2}\right)$$

A line width of the SRCG ($f_{LW}$) is as follows:

$$f_{LW} = \frac{\pi(1-p)}{32p^2 N^2 T_{unit}} \qquad \text{Equation (17)}$$

Since the line width and average cycle depend on only the parameter "N", a $$\frac{2f_{LW}}{f_0}$$

normalized line width transfers much better information on the output signal of the SRCG. The normalized line width is represented as follows.

$$\frac{2f_{LW}}{f_0} = \frac{\pi(1-p)}{4p^2 N} \qquad \text{Equation (18)}$$

The normalized line width is proportional to 1/N. The phase noise of the SRCG is reduced as the "N" increases.

Figure 6:
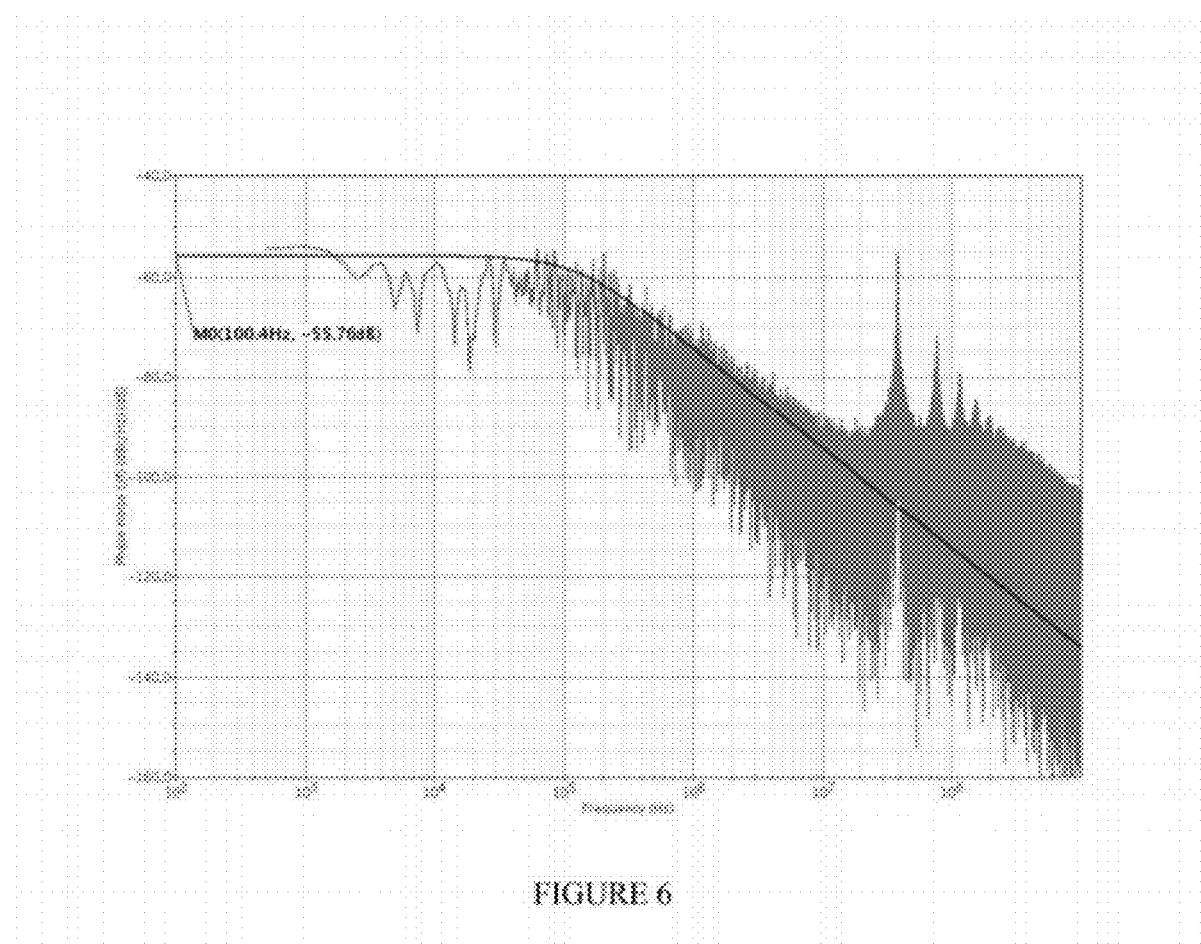
FIG. 6 shows an analyzed simulation result of the single side band spectrum L(f) of the SRCG according to an embodiment of the present invention.
Figure 7:
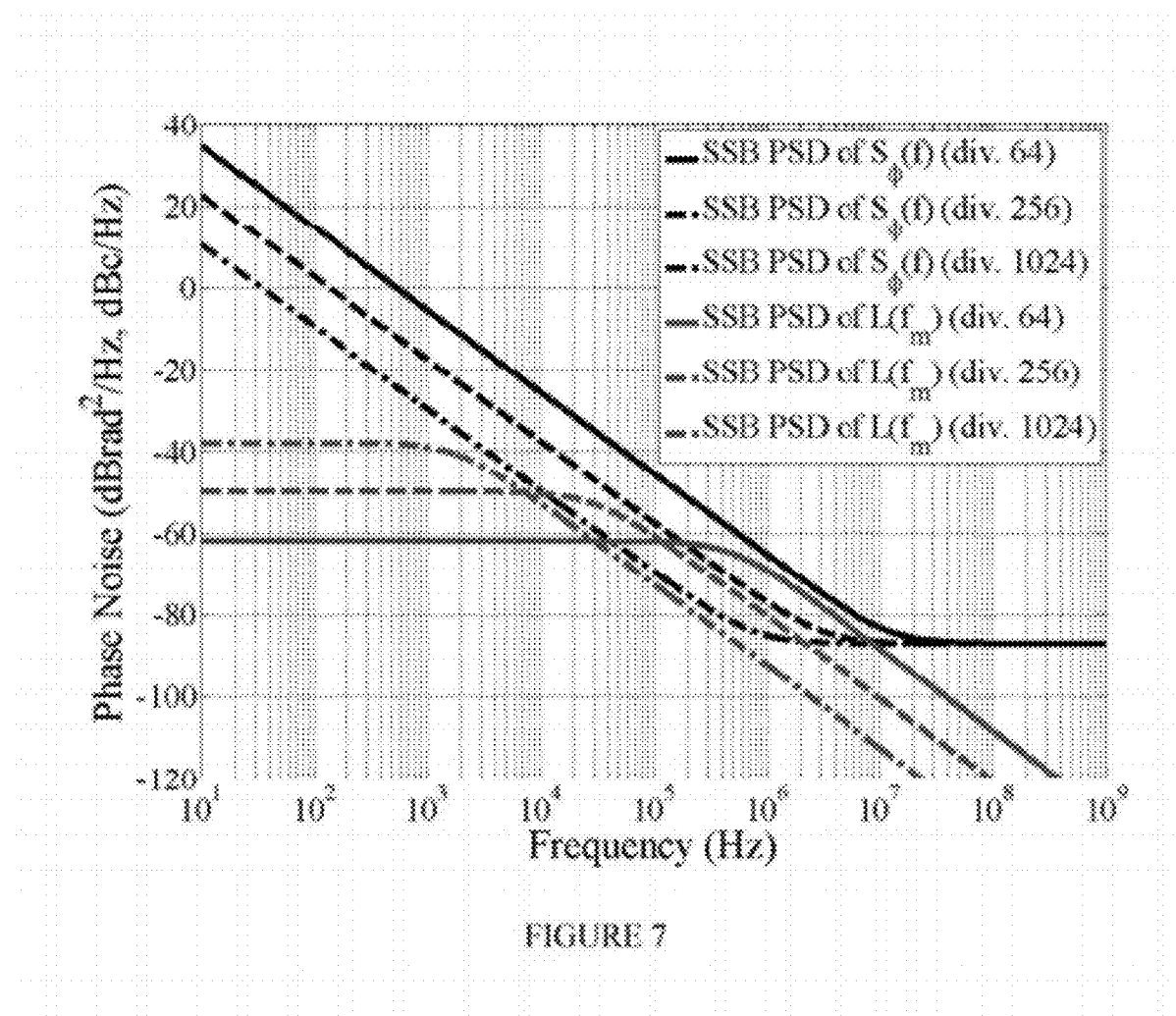
FIG. 7 shows a phase noise and L(f) of the SRCG according to an embodiment of the present invention.

FIG. 6 shows a simulation result with respect to equation (16) when the "N" is 128. Since the simulation result can be obtained through Fast Fourier transform after the SRCG signal is normalized and down-converted, time for simulation through use of the "N" of a small value can be saved. It can be said that the division ratio of 128 is so large that the phase noise is modeled by using the Gaussian process. FIG. 7 shows a single side band PSD of the phase noise of equation (11) and L(f) of equation (16). It can be found from equation (7) that equations (11) and (16) fit the following well-known relation.

$$L(f_m) \approx \frac{S_\phi(f)}{2} \qquad \text{Equation (19)}$$

Here, a frequency range is $$\frac{\pi(1-p)}{8p^2 N} f_0 < f < \frac{2}{\pi} f_0.$$

In the SRCG according to the embodiment, when the division ratio is not sufficiently large, a common phase frequency detector may malfunction with the SRCG according to the embodiment.

Figure 8:
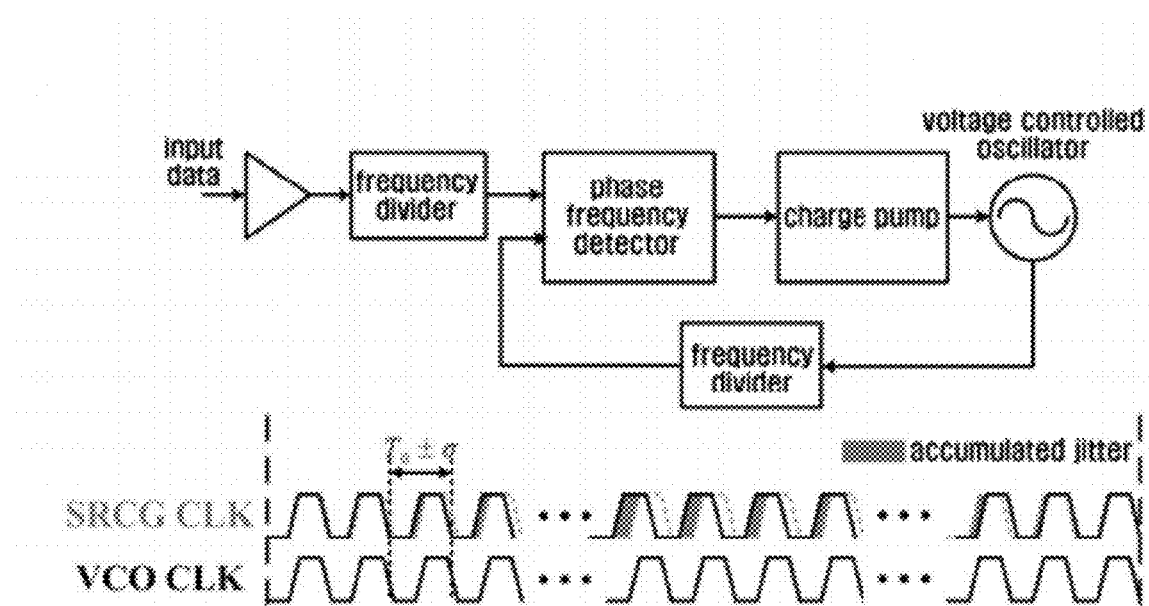
FIG. 8 shows an example of an accumulated jitter which is generated when the SRCG according to an embodiment of the present invention is used together with a conventional phase frequency detector.

FIG. 8 shows an example of an accumulated jitter which is generated when the SRCG according to the embodiment is used together with a conventional phase frequency detector. As shown in FIG. 8, this is because even when an oscillation frequency of a voltage controlled oscillator (VCO) 320 to be described later exactly matches the average frequency of the SRCG, a large period jitter is accumulated, which exists outside a closed-loop bandwidth of a phase locked loop (PLL) and eventually generates a large update pulse. This kind of problem becomes a more important issue in the SRCG divided at a low division ratio.

Figure 9:
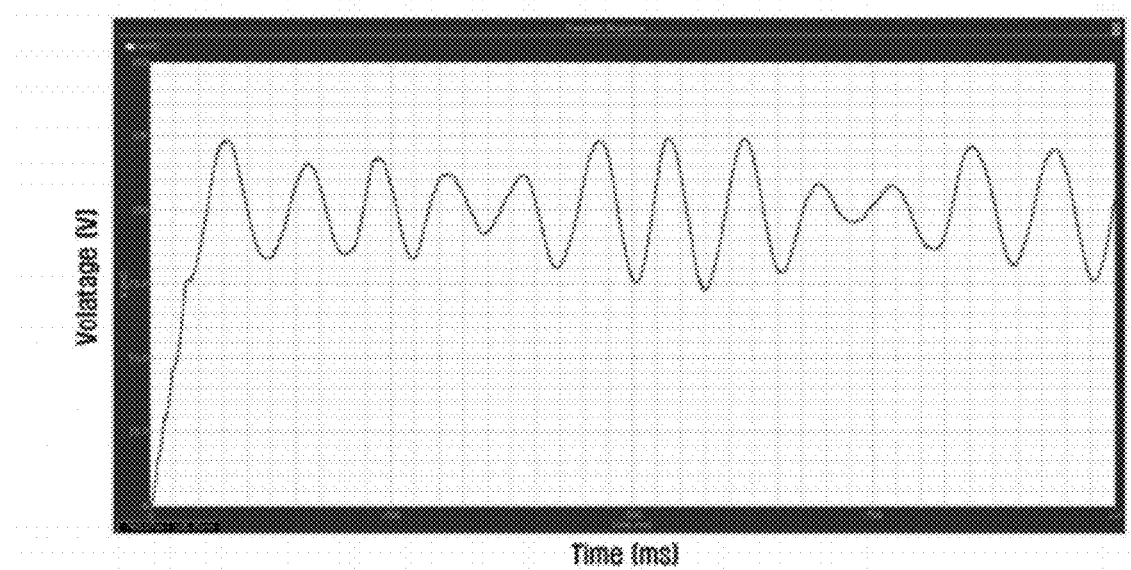
FIG. 9 shows a transient simulation result of a PFD based PLL used together with the SRCG according to an embodiment of the present invention when the "N" is 1,024.

FIG. 9 shows a transient simulation result of a PFD based PLL used together with the SRCG according to the embodiment when the "N" is 1,024. As shown in FIG. 9, though the frequency of the VCO follows the average frequency of the SRCG, the frequency of the VCO continuously changes due to a large phase jitter which is located outside the closed-loop bandwidth of the PLL and is not tracked.

Such a problem can be alleviated by using a frequency detector which is not sensitive to the accumulated phase jitter. Accordingly, as shown in FIG. 1, the frequency detector 200 according to the embodiment detects a frequency difference between the reference signal which is output from the SRCG 100 and the feedback signal which is output from the output signal generator 300 and has passed through the frequency divider 400.

Figure 10:
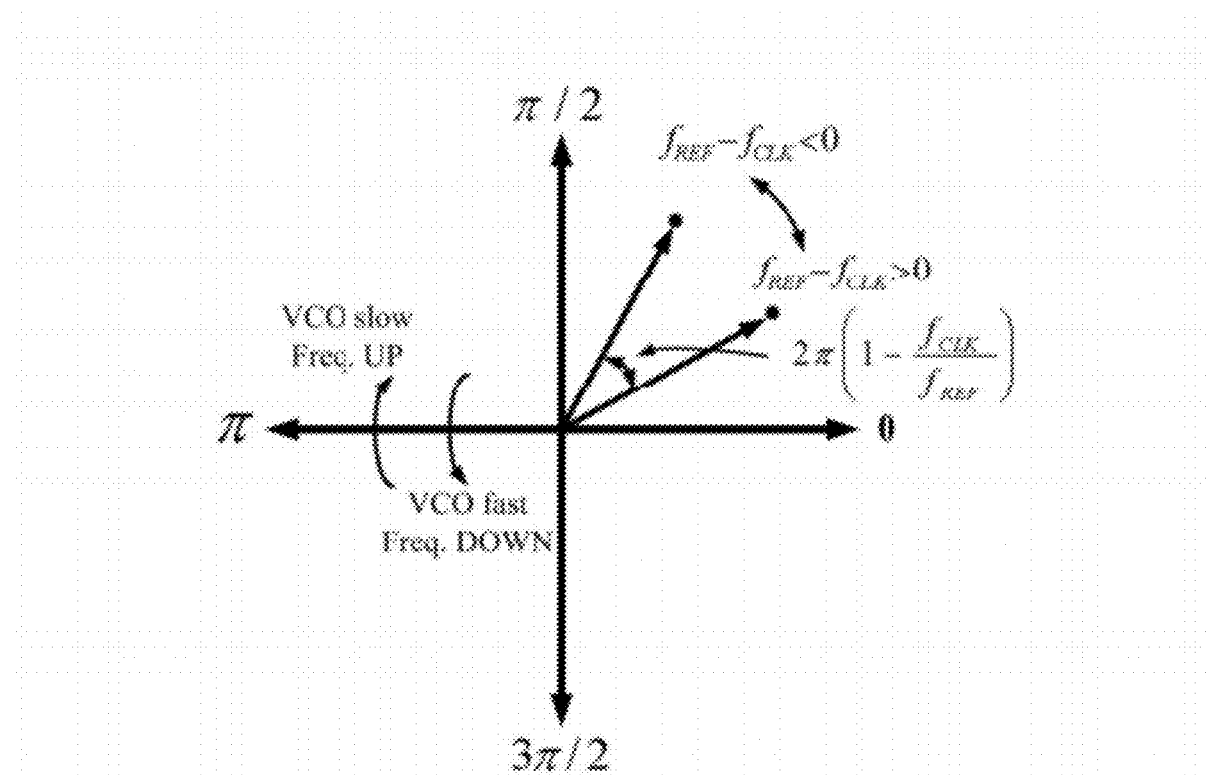
FIG. 10 shows a phasor diagram of a conventional rotational frequency detector.

An operation principle of a common rotational frequency detector used as the frequency detector 200 is shown in FIG. 10. When one cycle of the divided clock signal of the VCO is mapped onto the axis of a phasor diagram, two phasors mean the relative phase of two cycles close to a reference clock signal (i.e., an output signal of the SRCG) for the divided clock signal of the VCO. The sign and size of the phase difference mean a rotation direction and the magnitude of a frequency difference respectively. When the phase difference is positive, $f_{REF} < f_{CLK}$ and when the phase difference is negative, $f_{REF} < f_{CLK}$. The output $FD_{out}$ of the frequency detector 200 can be obtained as follows.

$$FD_{out} = \Delta\phi_k - \Delta\phi_{k-1} \qquad \text{Equation (20)}$$
$$= f_{CLK}(T_{CLK} - T_{REF})$$
$$= \frac{\Delta f}{f_{REF}}$$

Here, $\Delta\phi_k$ represents a phase difference between the $k^{th}$ divided clock signal of the VCO and the reference clock (output signal of the SRCG 100). $T_{REF}$ and $T_{CLK}$ mean one cycle of the reference clock and one cycle of the feedback signal respectively. $f_{REF}$ and $f_{CLK}$ correspond to a frequency of the reference signal and a frequency of the feedback signal respectively. A phase domain transfer function of the FD, which uses z-transform, is as follows.

$$\frac{FD_{out}(z)}{\Delta\phi(z)} = (1 - z^{-1}) \qquad \text{Equation (21)}$$

In order to represent S-domain, the following result is obtained by applying the bilinear transformation on equation (21).

$$\frac{\phi_{on}(z)}{\Delta\phi(z)} = \frac{sT_0}{1 + sT_0/2} \qquad \text{Equation (22)}$$

Here, $T_0$ represents an average cycle during a phase update at the frequency of the SRCG output signal.

Figure 11:
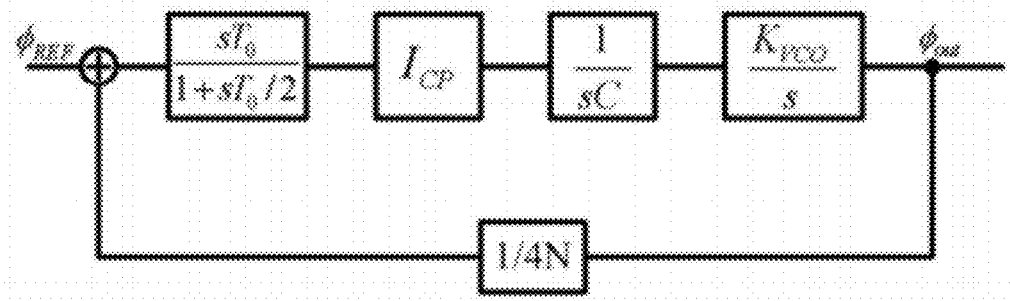
FIG. 11 is a block diagram of an S domain of a FLL according to an embodiment of the present invention.

In the statistical reference oscillator according to the embodiment, the FLL connected to the SRCG is designed in such a manner as to reduce the jitter coming from the SRCG and to refine the shape of the jitter. FIG. 11 is a block diagram of the FLL according to the embodiment. The expression of a phase-frequency domain of the FLL is as follows.

$$\left(\phi_{ref} - \frac{\phi_{out}}{4N}\right) \cdot \left(\frac{sT_0/2}{1+sT_0/4}\right) \cdot I_{CP} \cdot \frac{1}{sC} \cdot \frac{K_{VCO}}{s} = \phi_{out} \quad \text{Equation (23)}$$

$$H(s) = \frac{\phi_{out}}{\phi_{REF}} = \frac{\frac{2I_{CP}K_{VCO}}{C}}{s^2 + s\frac{2}{T_o} + \frac{2I_{CP}K_{VCO}}{4NC}},$$

Here, $K_{VCO}$ represents a yield of the voltage controlled oscillator (VCO) 320. $I_{CP}$ represents a current of a charge pump. "C" represents a capacitance of a loop filter. "N" represents a division ratio of the frequency divider. The more the division ratio increases, the more the gain of the FLL increases. However, the bandwidth of the FLL is constant. This is because a first pole is represented as follows regardless of the "N".

$$P_{3dB} = \frac{I_{CP}K_{VCO}T_{unit}}{C} \quad \text{Equation (24)}$$

An output power spectrum density function of the FLL, which receives the output signal of the SRCG, is given as follows.

$$S_\phi(f)|H(f)|^2 = 4\pi^2 T_{unit} \times \frac{1+(2\pi NT_{unit}f)^2}{(4\pi NT_{unit}f)^2} \times \quad \text{Equation (25)}$$

$$\frac{\left(\frac{2I_{CP}K_{VCO}}{C}\right)^2}{\left(\frac{2I_{CP}K_{VCO}}{4NC} - 4\pi^2 f^2\right)^2 + \left(\frac{2\pi f}{NT_{unit}}\right)^2}$$

Figure 12:
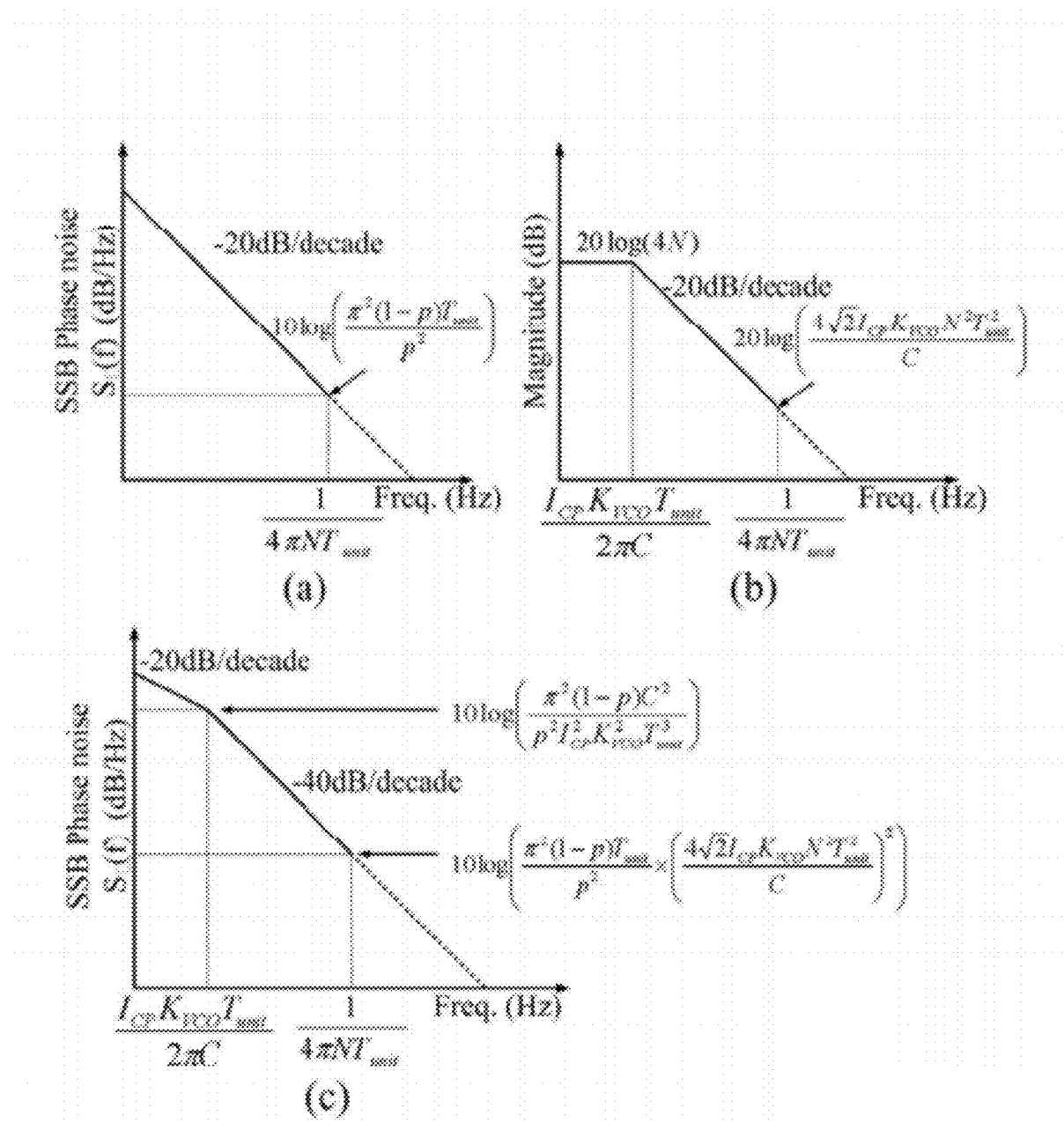
FIG. 12 a Bode plot of the SRCG, FLL and filtered phase noise according to an embodiment of the present invention.
Figure 13:
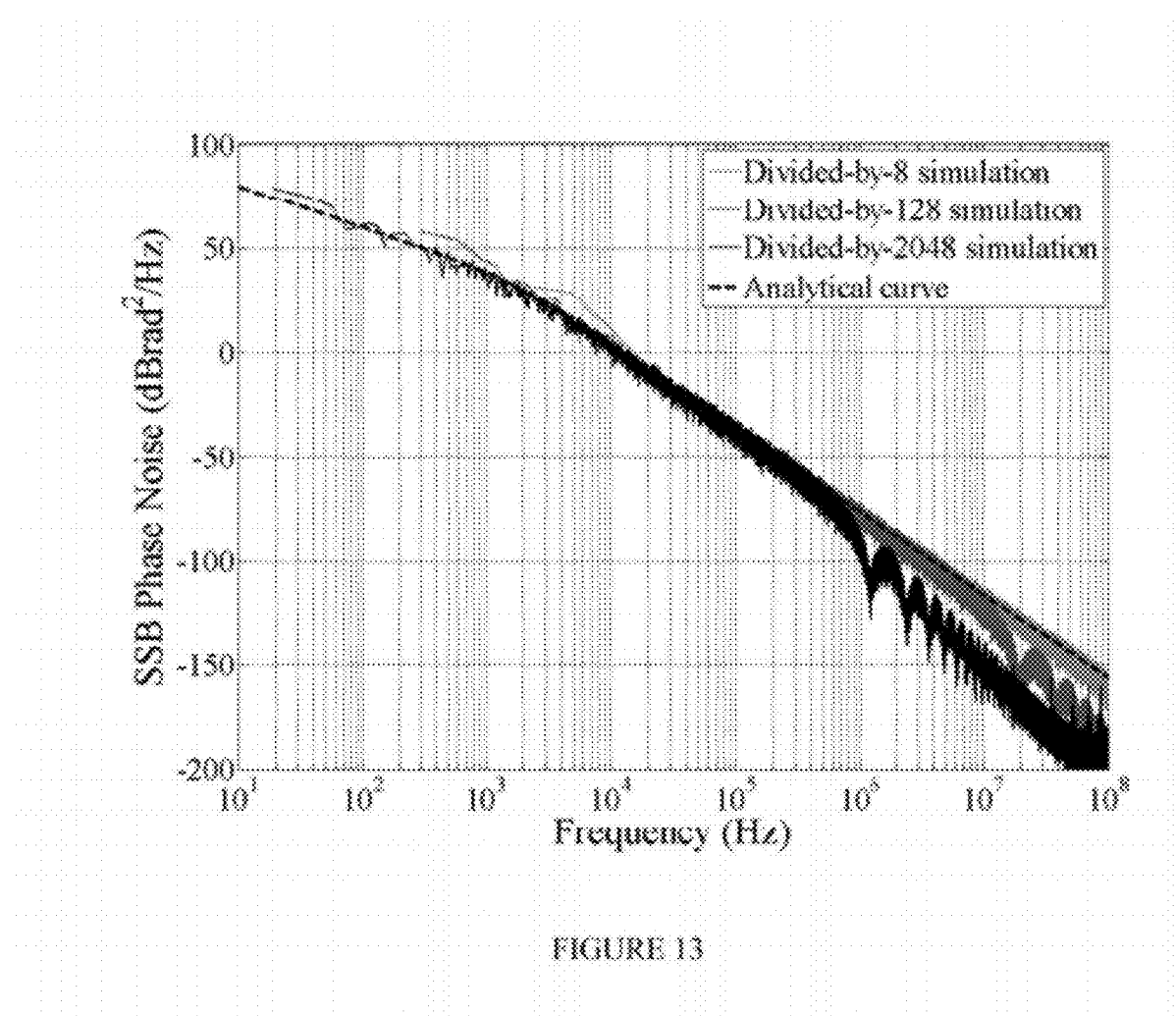
FIG. 13 shows a division ratio-based modified phase noise and theoretical curve of the SRCG according to an embodiment of the present invention.

When the division ratio "N" is increased, an output phase noise of the SRCG is, as shown in FIG. 10, reduced. However, since the gain of the FLL increases in proportion to the "N", the output phase noise, which has been filtered out by the FLL, of the SRCG does not change irrespective of the "N". The output phase noise of the FLL caused by the SRCG cannot be reduced by controlling the division ratio "N" or a second pole frequency of the FLL. Therefore, the only way to reduce total phase noise is to narrow the closed-loop bandwidth. FIG. 12 shows a Bode plot summarizing the aforementioned conditions. FIG. 13 shows a simulation result of the total output phase noise for the closed-loop bandwidth of the FLL.

Figure 14:
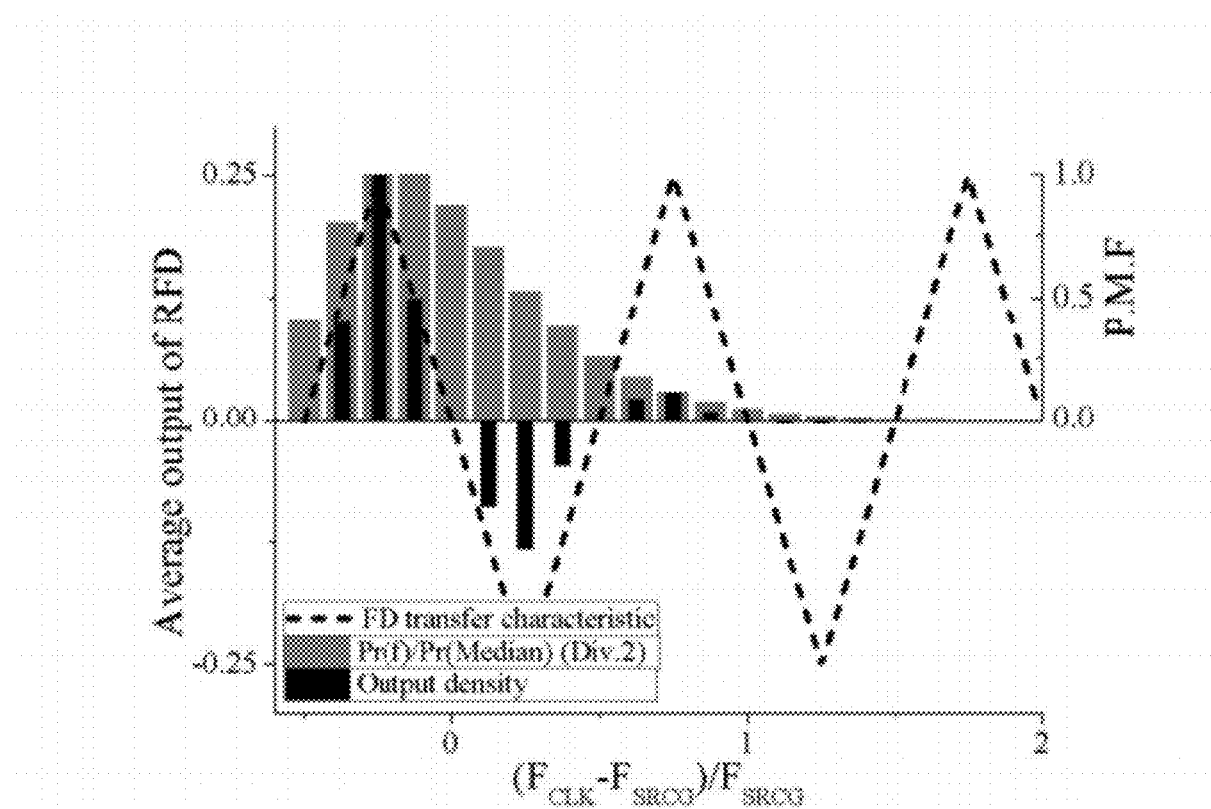
FIG. 14 is a curve showing a conventional rotational frequency detector transfer function, an edge probability distribution and their product.

A common rotational frequency detector (RFD) samples the reference clock by using a multi phase VCO clock, and then extracts a frequency difference between the VCO and the reference clock. A phase difference between the neighboring samples includes frequency information. A general transfer characteristic of the RFD is shown in FIG. 14. A normal operating range of the RFD is ±50% and a linear section is ±25%.

Figure 15:
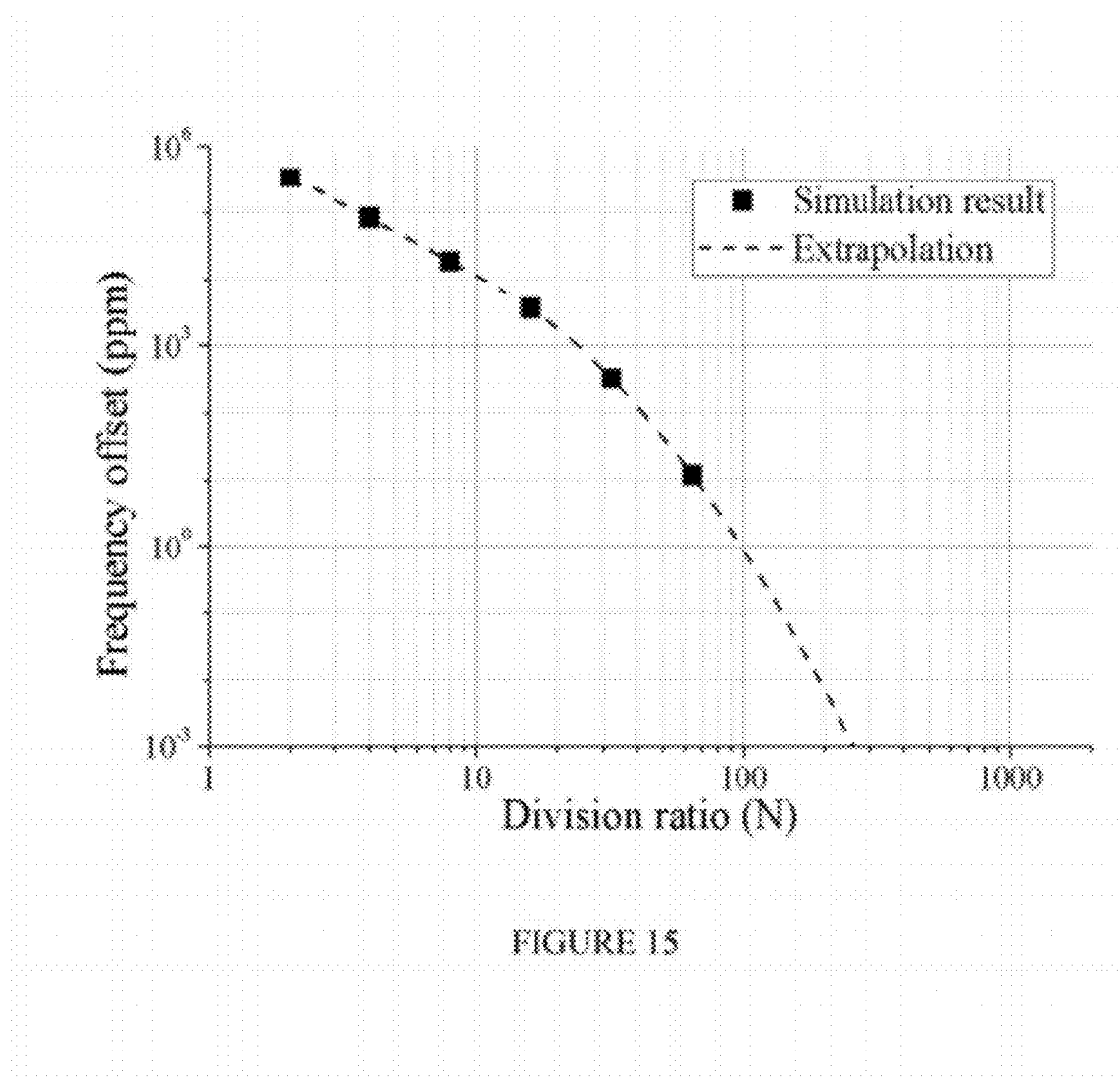
FIG. 15 is a curve showing a relation between a frequency offset and the division ratio "N" of the conventional rotational frequency detector.

FIG. 14 shows that when the random NRZ signal is divided at the division ratio of 2, a probability mass function (PMF) of the output signal is overlapped with the transfer characteristic of the RFD. Since the linear section of the RFD covers a portion of the generated random frequency, non-linearity of the RFD causes a frequency offset for the FLL output signal. If a first zero crossing of a transfer characteristic curve of the RFD is equal to the average frequency of the PMF, an asymmetric frequency distribution outside the linear section creates a DC component of the output of the RFD, which causes a frequency offset. Therefore, in order to reduce the frequency offset, most of the range of the PMF should be distributed within the linear section by sufficiently increasing the division ratio "N". FIG. 15 shows a simulation result of the size of the frequency offset based on the division ratio "N". As shown in FIG. 15, the division ratio should be higher than 40 in order that the frequency offset is equal to or less than 100 ppm.

Figure 16:
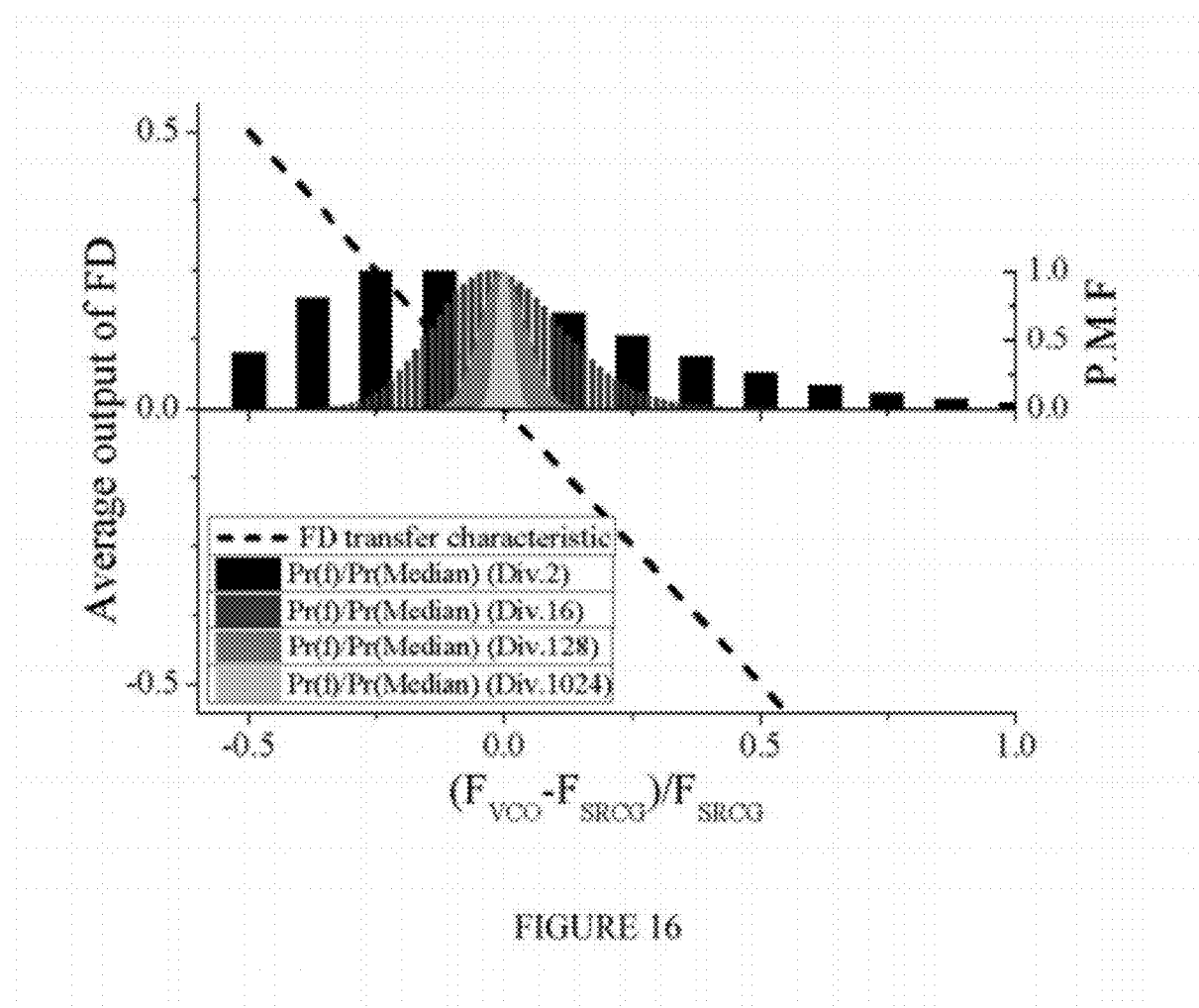
FIG. 16 is a curve showing a conventional counting-type frequency detector and an edge probability distribution.

The FD created by using a counter counts by using the VCO clock signal during one cycle of the reference clock signal and extracts a frequency difference from a difference between the reference value "M" and the number of the count. The reference value "M" corresponds to the counted number when the desired frequency is locked by the FLL. In this case, as shown in FIG. 16, since a full range of the frequency of the transfer function is linear, there is no offset with no regard to the division ratio of the SRCG 100.

Figure 17:
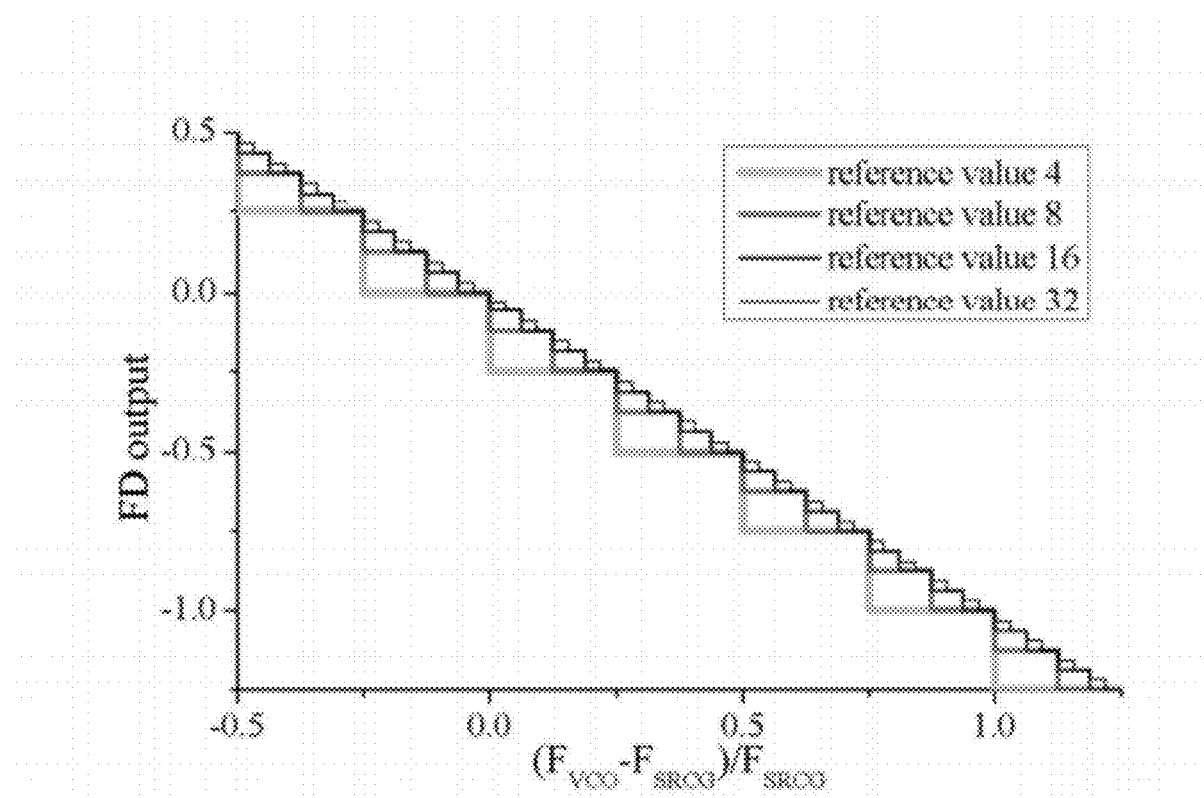
FIG. 17 shows a transfer function of a quantized counting-type frequency detector according to an embodiment of the present invention.
Figure 18:
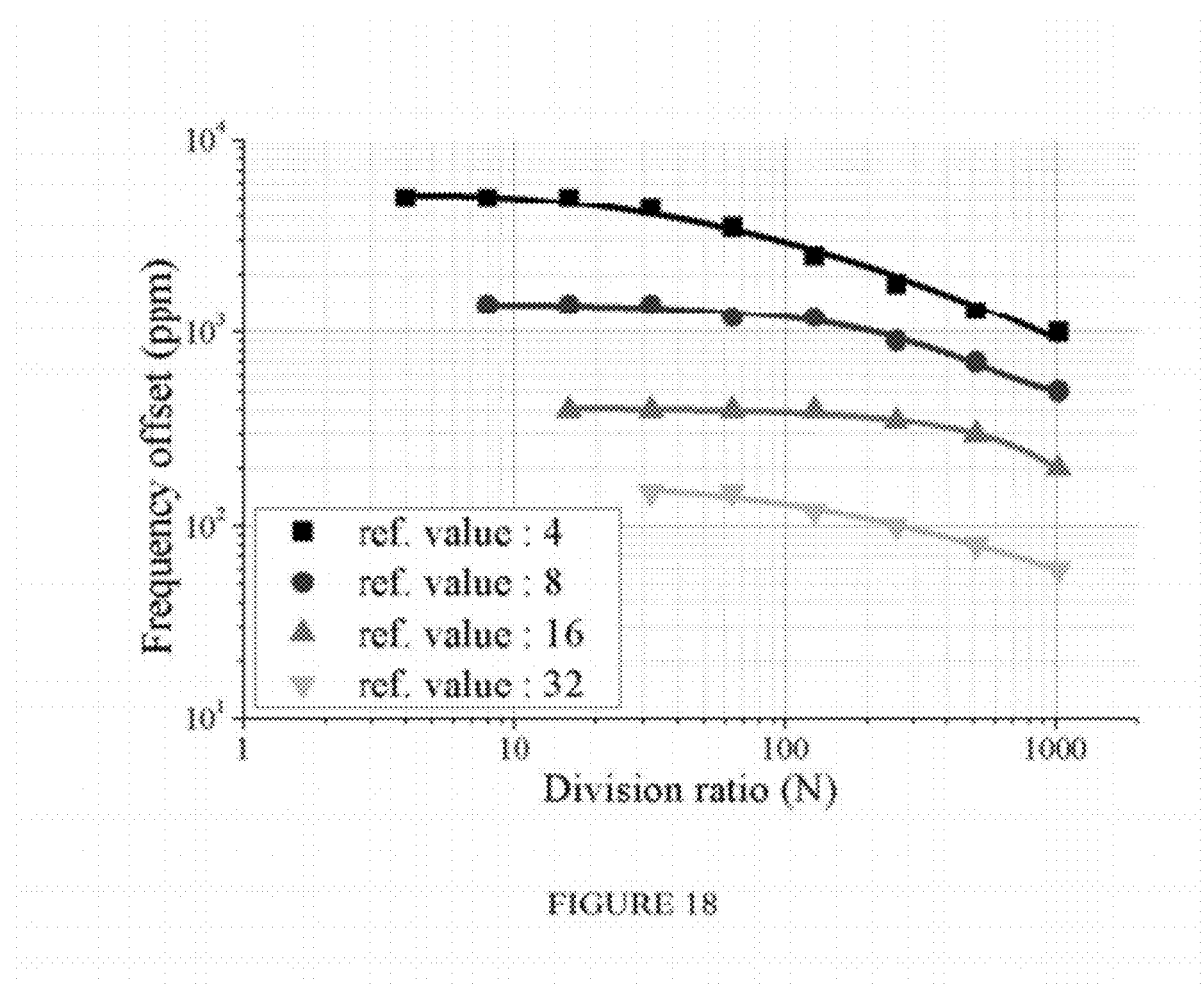
FIG. 18 is a graph showing frequency offset relations in accordance with the reference value "M" and the division ratio "N" of the conventional counting-type frequency detector.

However, if the "M" is smaller, a quantization effect is obtained as shown in FIG. 17. Since an average transfer function of the quantized frequency detector is located under an ideal average transfer function, the frequency offset appears in the FLL output signal. FIG. 18 is a graph showing a frequency offset which is based on the reference value "M" and the division ratio "N" and is obtained through a simulation. The frequency offset is reduced with the increases of the "M" and "N". The "M" is set to be equal to or more than 32 so as to cause the frequency offset to be equal to or less than 100 ppm.

Actually, the output of the frequency detector 200 is continuous during a time sample interval $T_0$ for holding an update signal. This process may be modeled by zero-order-hold (ZOH) of a cycle of $T_0$. A frequency response of the ZOH process appears on a phase noise curve. A frequency domain transfer function of the ZOH process is as follows:

$$H_{ZOH}(f) = \frac{1-e^{-2\pi f T_o}}{j2\pi f T_0} = e^{-2\pi f T_o} \mathrm{sinc}(fT_0) \quad \text{Equation (26)}$$

Through multiplication of equation (25) and equation (26), the phase noise may be represented to show the ZOH effect.

$$S_\phi(f)|H(f)|^2 = 4\pi^2 T_{unit} \times \frac{1+(4\pi NT_{unit}f)^2}{(8\pi NT_{unit}f)^2} \times \quad \text{Equation (27)}$$

$$\frac{\left(\frac{2I_{CP}K_{VCO}}{C}\right)^2}{\left(\frac{2I_{CP}K_{VCO}}{4NC} - 4\pi^2 f^2\right)^2 + \left(\frac{2\pi f}{NT_{unit}}\right)^2} \times \mathrm{sinc}^2(4NT_{unit}f)$$

Equation (26) is bilinearly transformed, and then an asymptotic line of equation (27) may be obtained as follows:

$$S_\phi(f)|H(f)|^2 = 4\pi^2 T_{unit} \times \frac{1+(4\pi NT_{unit}f)^2}{(8\pi NT_{unit}f)^2} \times \quad \text{Equation (28)}$$

-continued $$\frac{\left(\frac{2I_{CP}K_{VCO}}{C}\right)^2}{\left(\frac{2I_{CP}K_{VCO}}{4NC} - 4\pi^2 f^2\right)^2 + \left(\frac{2\pi f}{NT_{unit}}\right)^2} \times \frac{1}{1 + (4\pi NT_{unit}f)^2}$$

The position of the pole of the asymptotic line by the ZOH corresponds to $$\frac{1}{4\pi NT_{unit}}.$$

Figure 19:
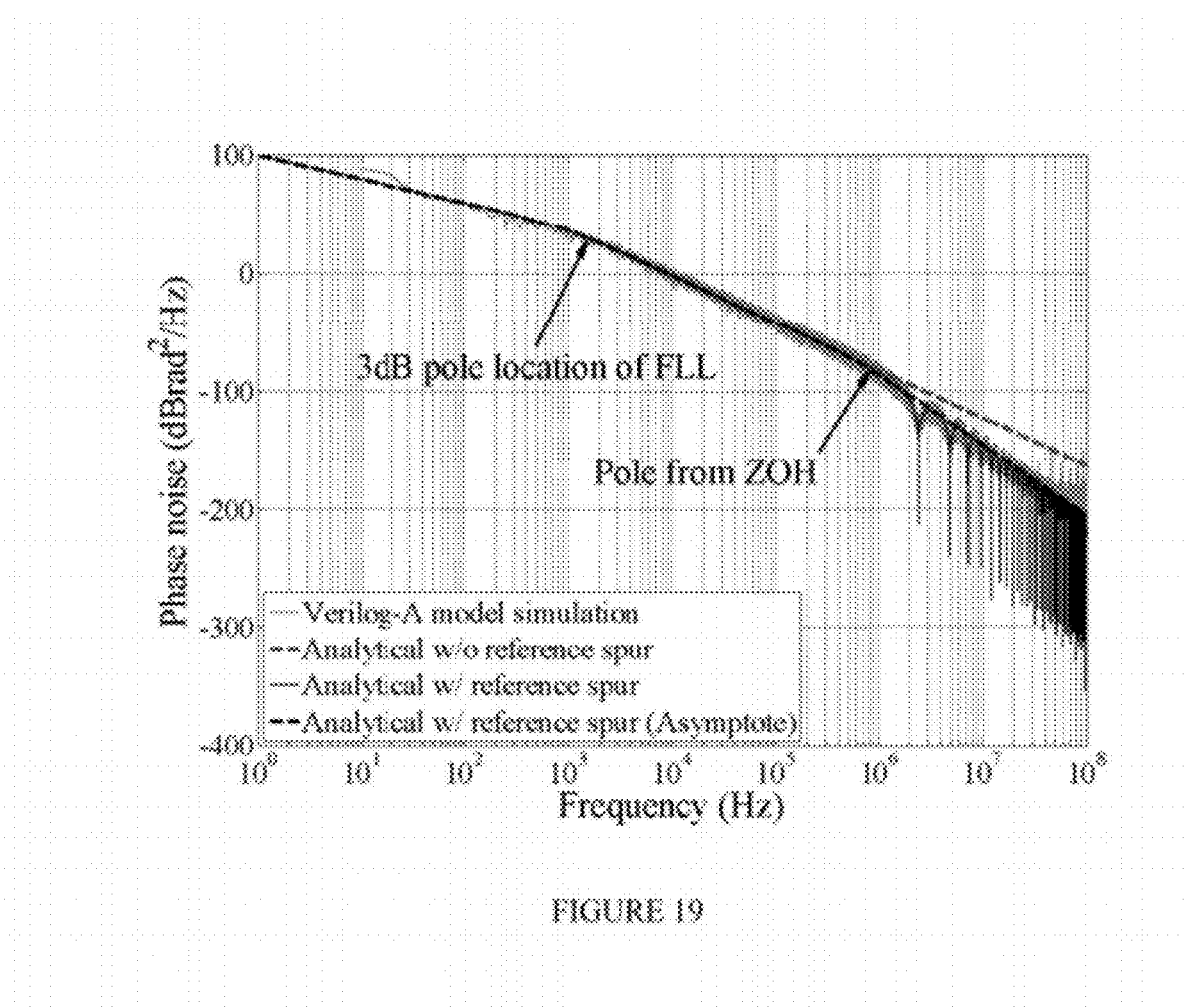
FIG. 19 shows a simulation result of a final theoretical formula and the phase noise of the FLL according to an embodiment of the present invention.

FIG. 19 shows that theoretical analyses of equation (27) and equation (28) are pertinent compared with a system simulation. Since the pole by the ZOH is in inverse proportion to the division ratio "N", the phase noise of the high frequency can be reduced by increasing the "N".

When a clock and data recovery (CDR) has a signal to noise ratio (SNR) penalty due to channel dispersion, the SRCG sharing the same input with the CDR generates a signal similar to the clock. However, the frequency of the signal may be lower than the frequency of an ideal clock. An error generated in the CDR in an environment including the dispersion causes the SRCG to miss a valid data transition. Therefore, due to the dispersion, data may remain without being partitioned. That is, in an environment including the dispersion and noise, it may occur that the SRCG is not able to correctly detect the input data. In this case, consequently, the frequency is locked in an undesired value.

Figure 20:
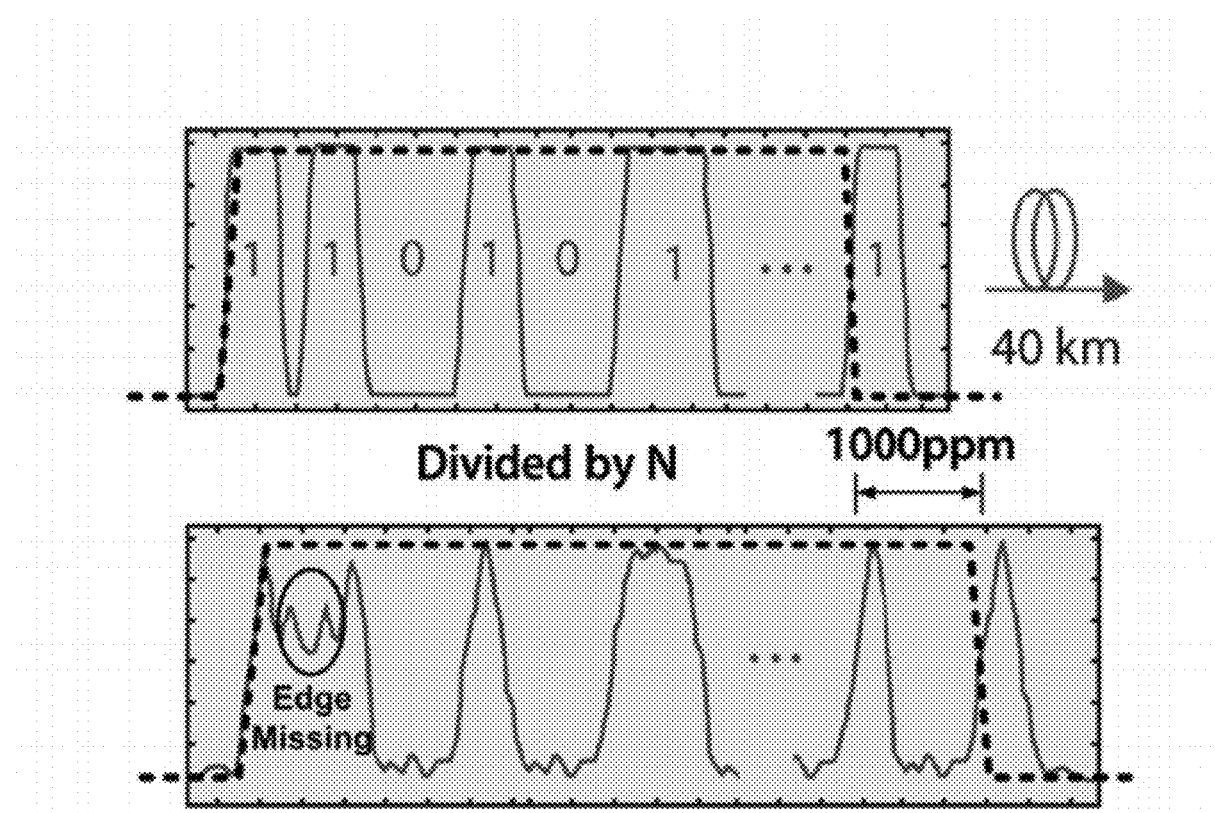
FIG. 20 shows a relation between the frequency of the SRCG and a bit error rate (BER) in a dispersed environment.

FIG. 20 shows a relation between the frequency of the SRCG and a bit error rate (BER) in a dispersed environment. When the CDR has the BER of $10^{-3}$ due to the dispersion, the output of the SRCG may be lower, by as much as 1,000 ppm, than an ideal output. This is because most of the errors are generated by not detecting the high frequency data. When the BER which has not been compensated is greater than $10^{-3}$, the frequency offset should be compensated in consideration of a narrow pull-in range of the phase locked loop.

Figure 21A:
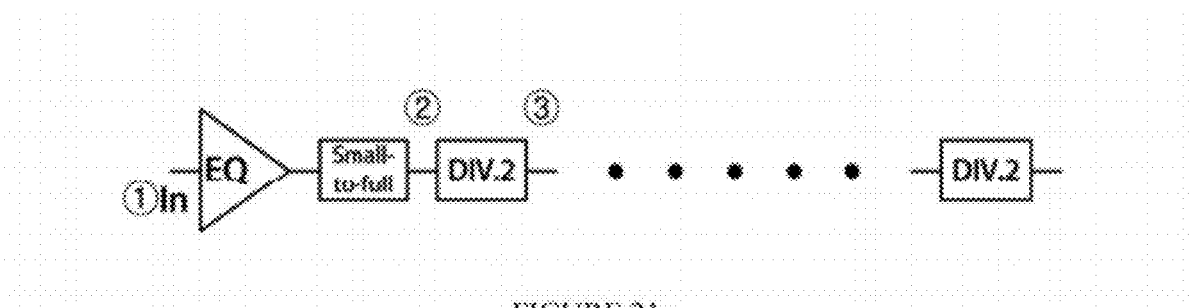
FIGS. 21a to 21d show examples of the structures and operations of a conventional single threshold slicer and a multiple threshold slicer.
Figure 21B:
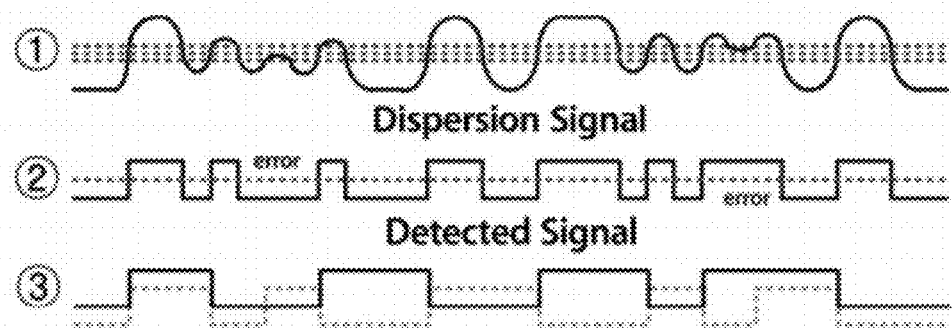

FIGS. 21a and 21b show a structure and operation of the SRCG including a conventional single threshold slicer. In FIG. 21b, examples of an input signal including dispersion, a detection signal and a division signal are respectively represented by reference numerals ① to ③ in conjunction with the structure of FIG. 21a. As shown in FIG. 21b, the single threshold slicer (represented by "small to full") is not able to correctly detect a valid data transition. FIG. 21 shows that the frequency of a signal divided by the frequency divider is lower than an ideal frequency. In other words, when the input data signal is transformed due to the effect of the dispersion and noise, it is not possible to errorlessly detect all of the signals by one threshold.

Therefore, in the embodiment, the multiple threshold slicer 110 may be used to errorlessly detect the signal transformed due to the dispersion and/or noise.

Figure 21C:
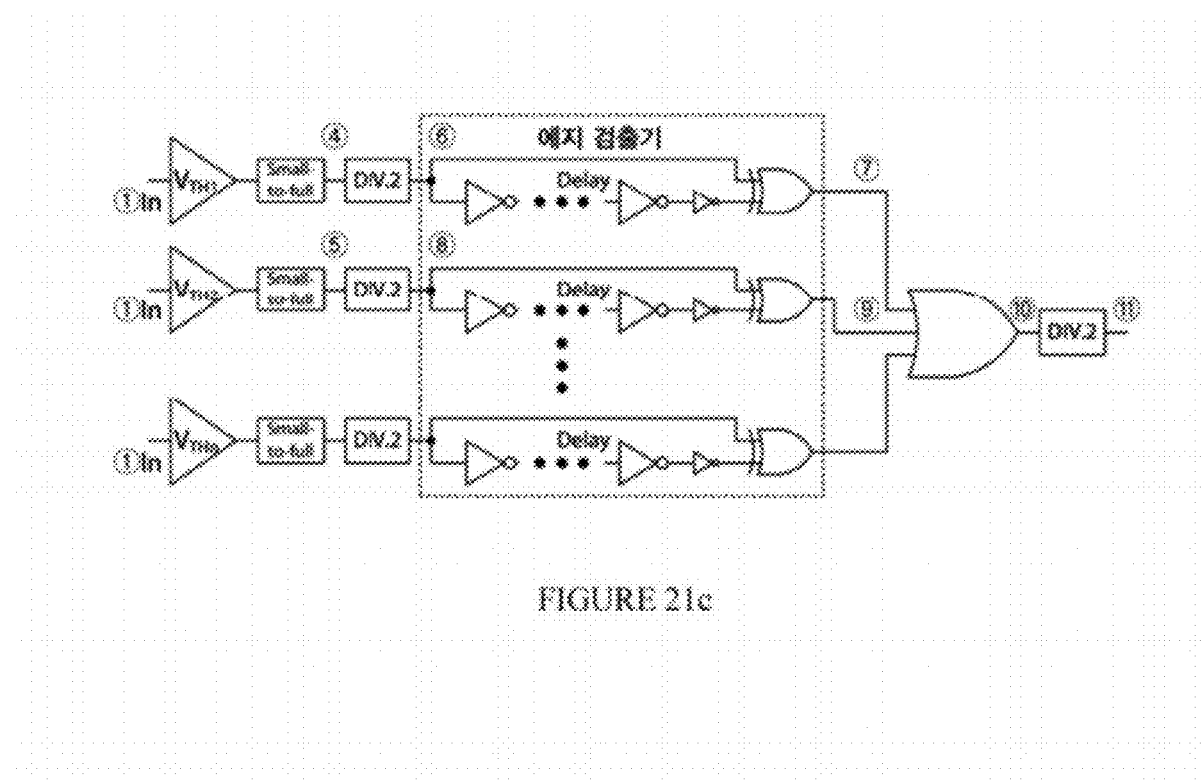
Figure 21D:
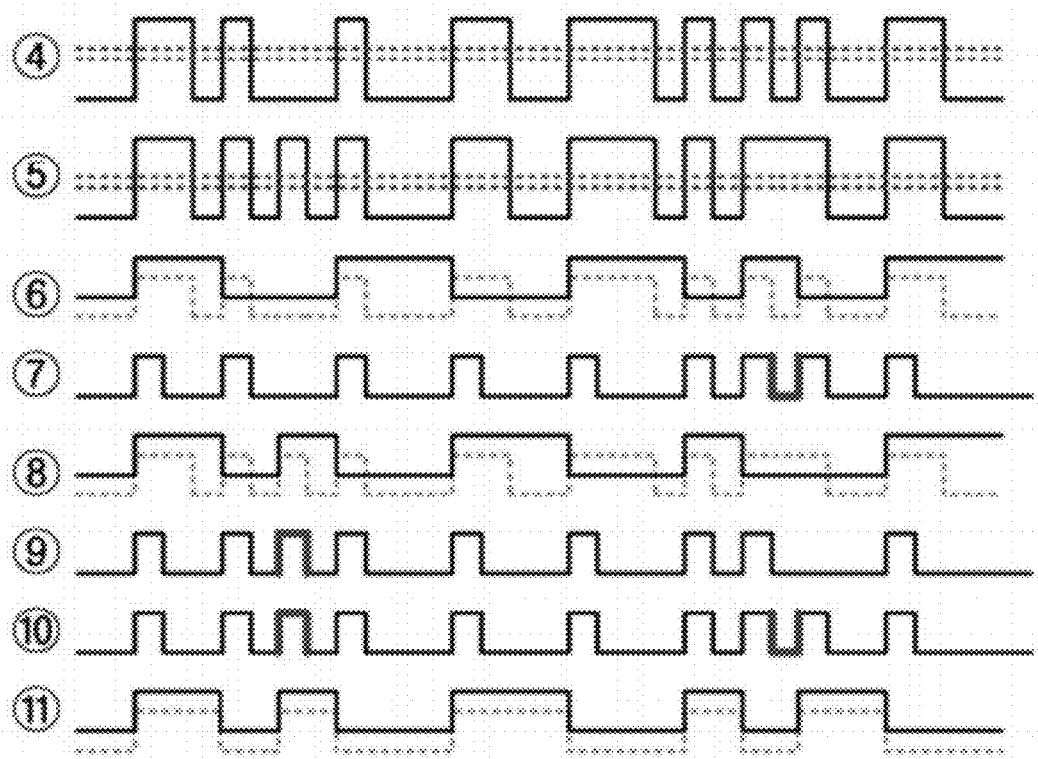

FIGS. 21c and 21d show an example of the structure and operation of the SRCG which includes the multiple threshold slicer 110 according to the embodiment and is tolerant of the dispersion.

As shown in FIG. 21d, the multiple threshold slicer 110 is able to detect a small data transition which may be missed by the single threshold slicer. That is, the multiple threshold slicer 110 is able to detect the data transition which has not been detected by the single threshold slicer among the dispersion environmental input data indicated by the reference numeral ① of FIG. 21b.

In FIG. 21d, examples of a detection signal for an input signal including dispersion, and a division signal are respectively represented by reference numerals ④ to ⑥ in conjunction with the structure of FIG. 21c. Through FIG. 21d and the reference numeral, ⑥ the input signal transformed due to the dispersion and noise through the multiple threshold slicer can be detected without errors. Accordingly, it can be found that the frequency of the divided signal detected through the multiple threshold slicer 110 is the same as an frequency of an ideal case.

In FIG. 21c, a slicer having a lower threshold detects a small transition starting from 0 and a slicer having a higher threshold detects a transition starting from 1. Here, the output from each of the multiple threshold slicers may be divided in order to reduce the operation frequency of subsequent blocks (DIV_2). A transition edge of the divided data can be detected, for example, by using an edge detector. Here, OR gates collect data transition information from the edge detector. The collected data may be divided after the average frequency is compensated.

The multiple threshold slicer 110 according to the embodiment can be implemented as shown in FIG. 21c. However, this is only an example. Any configuration capable of performing the functions mentioned above may be included in the scope of the present invention. For example, the slicer including three thresholds is used in FIG. 21 and moreover, more than or less than three threshold slicers may be also used. For example, to make the SRCG be more tolerant of the dispersion, a larger number of the threshold slicers may be used. Since it is necessary for the SRCG including the multiple threshold slicer to detect only one kind of the data transition, the SRCG can be operated at a data rate.

As shown in FIG. 1, the statistical references oscillator according to the embodiment includes the output signal generator 300 which outputs output signals based on an up-pulse signal or a down-pulse signal of the frequency detector 200. The output signal generator 300 includes a charge pump 310 and the voltage controlled oscillator (VCO) 320. The charge pump 310 charges or discharges electric charges in response to the up-pulse signal or the down-pulse signal. The voltage controlled oscillator (VCO) 320 oscillates the frequency-compensated and phase-compensated output signal in response to the output signal of the charge pump 310.

The charge pump 310 increases or decreases its output voltage in response to the up-pulse signal and the down-pulse signal. The statistical references oscillator according to the embodiment may further include a low pass filter (not shown) which removes noise and high frequency components which are included in the output voltage of the charge pump 310.

The voltage controlled oscillator (VCO) 320 outputs a frequency-compensated signal by using the output voltage of the charge pump 310. Consequently, the voltage controlled oscillator (VCO) 320 increases an output frequency by using the width of the up-pulse signal which is output from the frequency detector 200 or decreases an output frequency by using the width of the down-pulse signal.

As shown in FIG. 1, the statistical references oscillator according to the embodiment may include the frequency divider 400 which divides the output signal generated from the output signal generator 300 at a predetermined division ratio and outputs a feedback signal. In the embodiment, the division ratio may be determined as 4N in conjunction with the division ratio "N" of the frequency divider 120. The feedback signal, that is, the output signal of the frequency divider 400 is input to the frequency detector 200.

Figure 22:
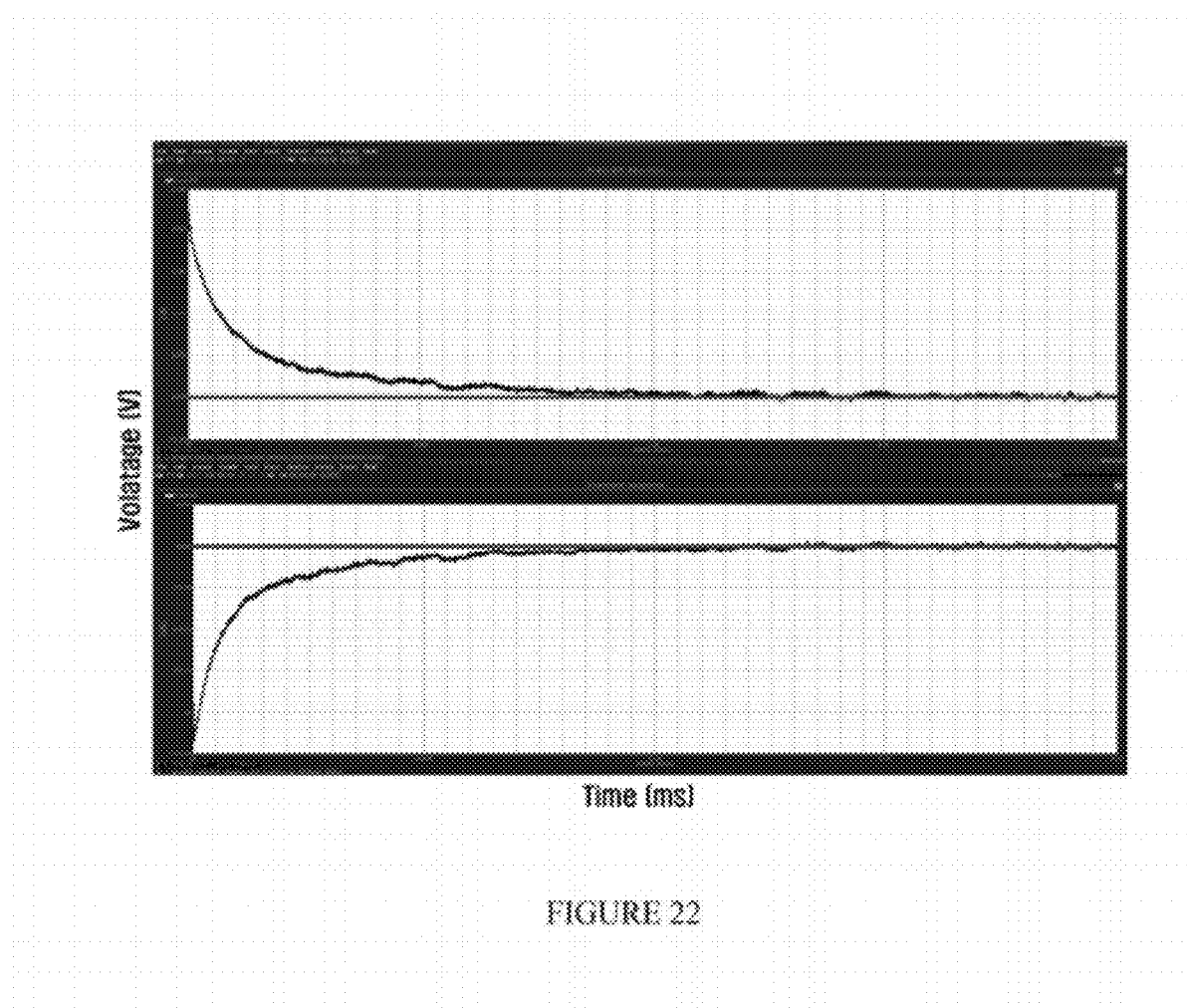
FIG. 22 is a simulation result of a transient response of the SRCG in an output terminal of the charge pump.

FIG. 22 is a simulation result of a transient response of the SRCG in an output terminal of the charge pump. An initial frequency is set so as to observe both a rising transient simulation and a falling transient simulation. Here, the division ratio "N" is 1,024.

Figure 23:
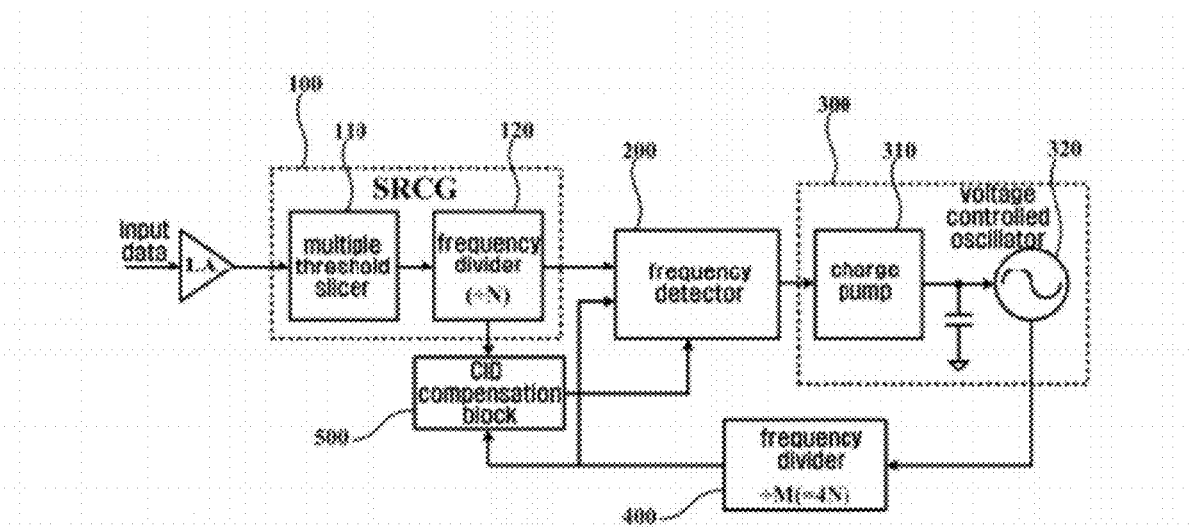
FIG. 23 shows an example of a statistical reference oscillator according to an embodiment of the present invention.

FIG. 23 shows an example of a statistical reference oscillator which further includes a CID compensation block 500 according to another embodiment. An actual data which is input to the statistical reference oscillator is not a common random NRZ data and includes a frame header. The frame header does not include packet information. Therefore, the frame header is not a random data. Accordingly, when a value obtained by passing the data including the frame header through a multiple divider is used as a reference signal, an inaccurate frequency locking may occur.

For example, when data including a consecutive identical digit (CID) which may exist in the frame header is divided, duration of the reference signal is increased and a signal output from the voltage controlled oscillator (VCO) 320 comes to have a locking frequency lower than that of an ideal case. Therefore, in order to remove such an error, it is required that the signal having the increased duration should be skipped during the process in which the data is divided by the frequency divider 120.

The skipping process will be described in short below. First, a mean and a variance of the signal from the divided input data are theoretically calculated. It is possible to calculate from the calculated mean and variance by using "student-distribution" how much less the duration of the signal should be with the reliability of 95% or 99%. The duration of the signal can be calculated by counting how many signals of VCO/16 are pulled in during the half cycle of the divided input data. When the statistical reference oscillator including the calculated t-test value is included in a predetermined locking range, the CID compensation block 500 is turned on. Here, when an undesired signal, that is, the CID within the frame header is generated, updating is skipped.

Figure 24:
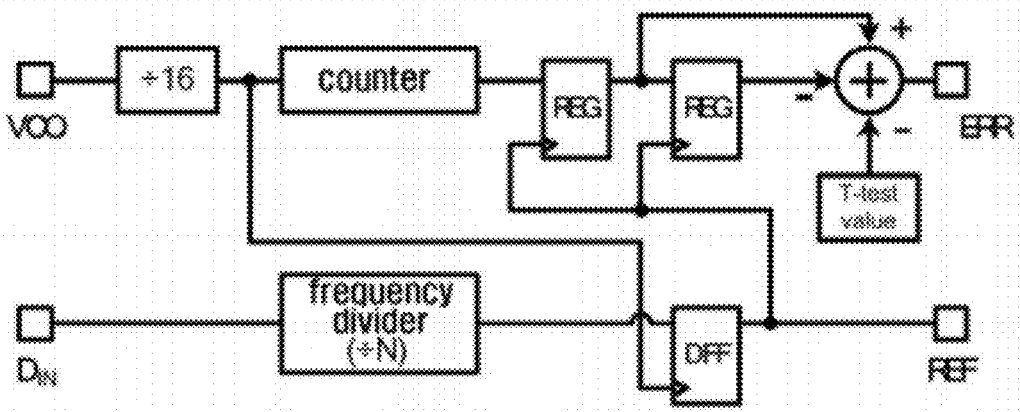
FIG. 24 shows an example of an implemented circuit of a CID compensation block according to an embodiment of the present invention.

FIG. 24 shows an example of an implemented circuit of the CID compensation block 500 according to the embodiment. This is only an example. The CID compensation block 500 may include another circuit capable of performing the functions mentioned above.

While the embodiment of the present invention has been described with reference to the accompanying drawings, it can be understood by those skilled in the art that the present invention can be embodied in other specific forms without departing from its spirit or essential characteristics. Therefore, the foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A statistical reference oscillator comprising:
   a stochastic reference clock generator which receives input data and outputs a reference signal obtained by dividing the received input data at a first frequency division ratio;
   a frequency divider which divides the frequency of an output signal at a second frequency division ratio and outputs a feedback signal;
   a frequency detector which outputs a difference signal based on a difference between the reference signal and the feedback signal;
   an output signal generator which outputs the output signal based on the difference signal; and
   a consecutive identical digit (CID) compensation block which prevents a non-random signal within the input data from being inputted to the frequency detector by skipping the non-random signal.

2. The statistical reference oscillator of claim 1, wherein the stochastic reference clock generator comprises a multiple threshold slicer and wherein the multiple threshold slicer detects a signal of the input data by using multiple thresholds.

3. The statistical reference oscillator of claim 2, wherein the second division ratio is four times as much as the first division ratio.

4. The statistical reference oscillator of claim 3, wherein be first division ratio is equal to or greater than 128.

5. The statistical reference oscillator of claim 2, wherein the stochastic reference clock generator further comprises a frequency divider and wherein the frequency divider of the stochastic reference clock generator divides an input signal from the multiple threshold slicer at the first division ratio.

6. The statistical reference oscillator of claim 5, wherein the second division ratio is four times as much as the first division ratio.

7. The statistical reference oscillator of claim 6, wherein the first division ratio is equal to or greater than 128.

8. The statistical reference oscillator of claim 5, wherein the difference signal corresponds to an up-pulse signal or a down-pulse signal based on the difference between the reference signal and the feedback signal.

9. The statistical reference oscillator of claim 8, wherein the output signal generator comprises:
   a charge pump which charges or discharges electric charges in response to the up-pulse signal or the down-pulse signal; and
   a voltage controlled oscillator of which oscillation frequency varies in response to an output signal of the charge pump.

10. The statistical reference oscillator of claim 2, wherein the difference signal corresponds to an up-pulse signal or a down-pulse signal based on the difference between the reference signal and the feedback signal.

11. The statistical reference oscillator of claim 10, wherein the output signal generator comprises:
   a charge pump which charges or discharges electric charges in response to the up-pulse signal or the down-pulse signal; and
   a voltage controlled oscillator of which oscillation frequency varies in response to an output signal of the charge pump.

12. The statistical reference oscillator of claim 1, wherein the difference signal corresponds to an up-pulse signal or a down-pulse signal based on the difference between the reference signal and the feedback signal.

13. The statistical reference oscillator of claim 12, wherein the output signal generator comprises:
   a charge pump which charges or discharges electric charges in response to the up-pulse signal or the down-pulse signal; and
   a voltage controlled oscillator of which oscillation frequency varies in response to an output signal of the charge pump.

14. The statistical reference oscillator of claim 1, wherein the second division ratio is four times as much as the first division ratio.

15. The statistical reference oscillator of claim 14, wherein the first division ratio is equal to or greater than 128.

16. The statistical reference oscillator of claim 1, wherein the CID compensation block receives the reference signal and the output signal and determines the non-random signal within the input data by using a mean and a variance of the reference signal.

* * * * *